United States Patent
Hayashi et al.

(10) Patent No.: US 9,005,775 B2
(45) Date of Patent: Apr. 14, 2015

(54) COMPOSITION, FILM USING THE COMPOSITION, CHARGE TRANSPORT LAYER, ORGANIC ELECTROLUMINESCENCE DEVICE, AND METHOD FOR FORMING CHARGE TRANSPORT LAYER

(75) Inventors: Naoyuki Hayashi, Kanagawa (JP); Ryo Nishio, Kanagawa (JP); Saki Takada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 226 days.

(21) Appl. No.: 13/238,943

(22) Filed: Sep. 21, 2011

(65) Prior Publication Data

US 2012/0080666 A1 Apr. 5, 2012

(30) Foreign Application Priority Data

Sep. 30, 2010 (JP) ................. P2010-223255

(51) Int. Cl.
- *H01L 51/50* (2006.01)
- *H01L 51/00* (2006.01)
- *C08F 4/04* (2006.01)
- *C08F 4/80* (2006.01)

(52) U.S. Cl.
CPC ......... H01L 51/0059 (2013.01); *H01L 51/0085* (2013.01); *H01L 51/5048* (2013.01); C08F 4/04 (2013.01); C08F 4/80 (2013.01); *Y10S 428/917* (2013.01)

(58) Field of Classification Search
USPC ................. 428/690, 917; 313/504, 505, 506; 564/26, 426, 434
See application file for complete search history.

(56) References Cited

U.S. PATENT DOCUMENTS

| | | | |
|---|---|---|---|
| 2006/0073360 A1 | 4/2006 | Ise et al. | |
| 2007/0202356 A1* | 8/2007 | Okada | 428/690 |
| 2008/0171273 A1* | 7/2008 | Cheong et al. | 430/48 |
| 2009/0021147 A1* | 1/2009 | Sugita et al. | 313/504 |
| 2010/0108991 A1* | 5/2010 | Tanaka et al. | 257/40 |
| 2010/0327738 A1 | 12/2010 | Toba et al. | |
| 2011/0042664 A1* | 2/2011 | Katoh et al. | 257/40 |

FOREIGN PATENT DOCUMENTS

| | | | |
|---|---|---|---|
| JP | 2004-287326 A | 10/2004 | |
| JP | 2006-128634 A | 5/2006 | |
| JP | 2008-4671 A | 1/2008 | |
| JP | 2008-10648 A | 1/2008 | |
| JP | 2008-147399 A | 6/2008 | |
| JP | 2008-218983 A | 9/2008 | |
| JP | 2009-16739 A | 1/2009 | |
| WO | WO 2009/104708 A1 | 8/2009 | |
| WO | WO 2009/131165 A1 | 10/2009 | |

OTHER PUBLICATIONS

Japanese Office Action, dated Dec. 3, 2013, issued in Application No. 2010/223255 with English language translation.

* cited by examiner

*Primary Examiner* — Gregory Clark

(74) *Attorney, Agent, or Firm* — Birch, Stewart, Kolasch & Birch, LLP

(57) ABSTRACT

A composition includes: (B) an arylamine derivative having at least one polymerizable group; and (A) a cyano group-free azo based polymerization initiator.

8 Claims, 1 Drawing Sheet

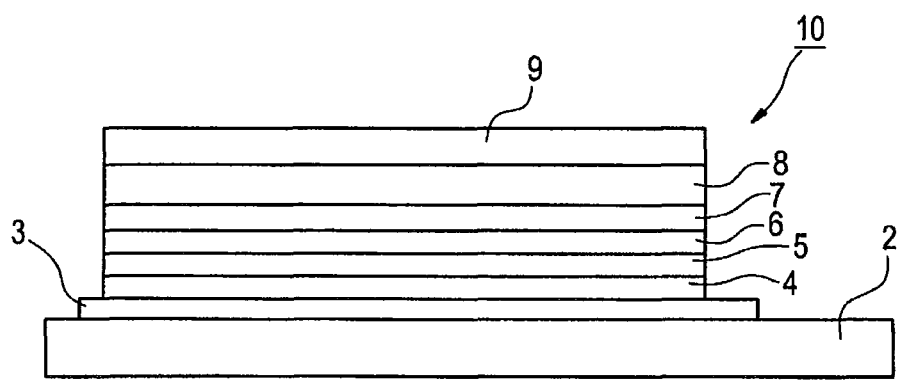

COMPOSITION, FILM USING THE COMPOSITION, CHARGE TRANSPORT LAYER, ORGANIC ELECTROLUMINESCENCE DEVICE, AND METHOD FOR FORMING CHARGE TRANSPORT LAYER

This application is based on and claims priority under 35 U.S.C. §119 from Japanese Patent Application No. 2010-223255 filed Sep. 30, 2010, the entire disclosure of which is herein incorporated by reference.

BACKGROUND OF THE INVENTION

1. Field of the Invention

The present invention relates to a composition, a film using the composition, a charge transport layer, an organic electroluminescence device, and a method for forming a charge transport layer. The composition of the invention is useful as a composition for organic electroluminescence device.

2. Description of the Related Art

With respect to devices utilizing an organic material, studies regarding an organic electroluminescence device (hereinafter sometimes as "OLED" or "organic EL device"), a transistor utilizing an organic semiconductor, and the like are actively carried out. In particular, organic electroluminescence devices are expected to be developed for large-area full-color display devices of a solid emission type or illumination applications as an inexpensive large-area surface light source. In general, an organic electroluminescence device is constituted of an organic layer including a light emitting layer and a pair of counter electrodes interposing the organic layer therebetween. When a voltage is impressed to such an organic electroluminescence device, an electron is injected from a cathode, and a hole is injected from an anode, respectively into the organic layer. The electron and the hole are recombined in the light emitting layer, and at the time when an energy level returns from a conduction band to a valence band, energy is released as light, thereby obtaining light emission.

An organic EL device can be fabricated by film-forming a light emitting layer and other organic layer by means of, for example, a dry method such as vapor deposition or a wet method such as coating. Above all, a wet method is given attention from the viewpoint of productivity or the like.

It is known that in an organic EL device fabricated by means of a wet method such as coating, when an arylamine derivative having a polymerizable group (for example, a vinyl group or an allyl group) is used as a hole transport layer forming material, light emission efficiency of the organic EL device increases, and durability is enhanced.

In the related art, it is known that when an arylamine derivative having a polymerizable group is film-formed with a polymerization initiator-free coating liquid, and the polymerizable group is polymerized in an inert gas ($N_2$) atmosphere by heating or upon irradiation with ultraviolet light (UV light) to crosslink the arylamine derivative, thereby forming a layer, the layer is insolubilized in the coating liquid for forming a light emitting layer. For example, JP-A-2008-4671 discloses that a coating solution having an arylamine derivative having a polymerizable group dissolved in toluene is coated, irradiated with ultraviolet light (UV light) for 30 seconds and then dried in vacuo at 60° C. for one hour, thereby forming a hole transport layer. Also, JP-A-2009-16739 discloses that a solution of an arylamine derivative having an acryloyl group as a polymerizable group dissolved in methyl isobutyl ketone is coated and then heated for curing at 200° C. for 30 minutes, thereby forming a hole injection layer.

However, when ultraviolet light is irradiated, there may be the case where a decomposition reaction of the arylamine derivative is caused due to the ultraviolet light, and there is a concern that desired characteristics to be caused due to the arylamine derivative are lost. In consequence, it is demanded to allow a polymerization reaction to proceed with efficiency without irradiation with ultraviolet light.

Also, in order to form a film capable of providing suitable device characteristics by means of a polymerization reaction by only heating, since a high-temperature and long-term polymerization reaction is required, it is demanded to improve a manufacturing condition. Specifically, it is demanded that not only the polymerization reaction proceeds with efficiency at a milder temperature and for a short period of time, but an organic EL device using a film formed therefrom has favorable device characteristics.

SUMMARY OF THE INVENTION

In a film-forming method of an arylamine derivative having a polymerizable group in the related art, there are involved such problems that a lowering of device performance to be caused due to decomposition of the arylamine derivative by irradiation with ultraviolet light occurs; and that in order to obtain suitable device characteristics, a high-temperature and long-term heat polymerization condition is required, and improvements therefor were demanded.

A problem of the invention is to solve the foregoing problem of the related art and to achieve the following objects.

That is, an object of the invention is to provide a composition which is useful for providing an organic electroluminescence device using an arylamine derivative having a polymerizable group as a material for organic electroluminescence device and keeping favorable efficiency and durability; and which is excellent in storage stability and capable of allowing a polymerization reaction to proceed under a milder condition than that of the related art; and in which a film formed therefrom has high resistance to an organic solvent. Incidentally, what the formed film has high resistance to an organic solvent is a preferred performance in fabricating an organic electroluminescence device by means of stacking by a wet method.

Also, another object of the invention is to provide a film using the foregoing composition, a charge transport layer, an organic electroluminescence device, and a method for forming a charge transport layer.

In view of the foregoing circumstances, the present inventors made extensive and intensive investigations. As a result, it has been found that the foregoing problem can be solved by allowing a composition containing an arylamine derivative having at least one polymerizable group to further contain a cyano group-free azo based polymerization initiator.

That is, the means for solving the foregoing problem are as follows.

[1] A composition, comprising:

(B) an arylamine derivative having at least one polymerizable group; and (A) a cyano group-free azo based polymerization initiator.

[2] The composition as described in [1] above, wherein the cyano group-free azo based polymerization initiator (A) is represented by the following formula (PI):

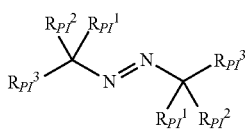

Formula (PI)

wherein each of $R_{PI}^1$ and $R_{PI}^2$ independently represents an alkyl group or an aryl group;

$R_{PI}^3$ represents —C(=O)—O—$R_{PI}^4$, —O—C(=O)—$R_{PI}^4$, or —C(=O)—NH—$R_{PI}^4$; and $R_{PI}^4$ represents an alkyl group or a cycloalkyl group.

[3] The composition as described in [1] or [2] above, wherein the cyano group-free azo based polymerization initiator (A) has a 10 hour half-life temperature in a range of from 60 to 70° C.

[4] The composition as described in any one of [1] to [3] above, wherein a decomposition product formed from the cyano group-free azo based polymerization initiator (A) is azeotropic with water.

[5] The composition as described in any one of [1] to [4] above, wherein the arylamine derivative having at least one polymerizable group (B) is represented by the following formula (1) or formula (2):

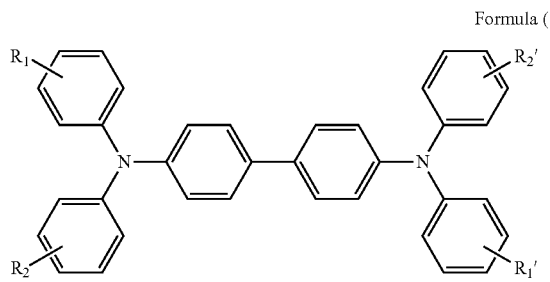

Formula (1)

wherein each of $R_1$ and $R_1'$ independently represents a polymerizable group; and each of $R_2$ and $R_2'$ independently represents a hydrogen atom or a substituent:

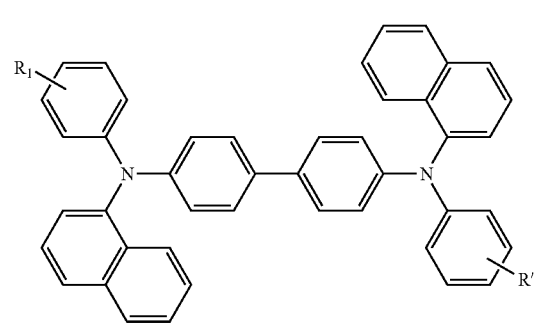

Formula (2)

wherein each of R and R' independently represents a polymerizable group.

[6] The composition as described in any one of [1] to [5] above, wherein the polymerizable group is either a vinyl group or an allyl group.

[7] A film, which is formed by applying the composition as described in any one of [1] to [6] above so as to form a coated composition and heating the coated composition.

[8] A charge transport layer, which is the film as described in [7] above.

[9] An organic electroluminescence device, comprising: the charge transport layer as described in [8] above.

[10] The organic electroluminescence device as described in [9] above, wherein the charge transport layer is formed on a hole injection layer containing an iridium complex.

[11] A method for forming a charge transport layer, comprising:

applying the composition as described in any one of [1] to [6] above so as to form a coated composition; and heating the coated composition.

BRIEF DESCRIPTION OF THE DRAWING

The features of the invention will appear more fully upon consideration of the exemplary embodiment of the invention, which is schematically set forth in the drawing, in which:

FIGURE is a diagrammatic view showing one example of a layer configuration of an organic electroluminescence device according to the invention.

DETAILED DESCRIPTION OF THE INVENTION

The invention is hereunder described in detail. Incidentally, in this specification, a numerical range expressed by the terms "a number to another number" means a range falling between the former number indicating a lower limit value of the range and the latter number indicating an upper limit value thereof.

The composition of the invention contains an arylamine derivative having at least one polymerizable group and a cyano group-free azo based polymerization initiator.

Although the reason why according to the use of the composition of the invention, it is possible to provide a composition which is useful for providing an organic electroluminescence device keeping favorable efficiency and durability; and which is excellent in storage stability and capable of allowing a polymerization reaction to proceed under a milder condition than that of the related art; and in which a film formed therefrom has high resistance to an organic solvent is not elucidated yet, it may be assumed as follows.

In view of the fact that the composition of the invention contains a polymerization initiator, it is possible to allow a polymerization reaction of the polymerizable group which the arylamine derivative has to proceed favorably at a low temperature and for a short period of time as compared with the case of not containing a polymerization initiator. Meanwhile, there was a concern that when a polymerization initiator is used for the polymerization reaction, the polymerization initiator adds to terminals of the arylamine polymer and remains, or a decomposition product of the polymerization initiator remains in the film, thereby giving the device adverse influences such as a lowering in efficiency or durability. According to the invention, it has been found that when an azo based polymerization initiator not having a cyano group that is considered to adversely affect the device is selected among various polymerization initiators and used, not only it is possible to achieve the polymerization at a low temperature and for a short period of time as compared with the case of not containing a polymerization initiator, but a device which is not lowered in efficiency and durability is provided as compared with a device obtained by using a heat polymerization reaction. The reason why when the polymerization initiator having a cyano group or its decomposition product remains in the film, the device is adversely affected is not elucidated yet. However, since the cyano group has a high dielectric constant, it may be assumed that the fact that the polymerization initiator having a cyano group or its decomposition product remains in a film works to inhibit the transfer of a charge, and as a result, the efficiency and durability of a device obtained using the subject film are lowered. Also, according to the composition of the invention, the polymerization reaction proceeds favorably even under a mild polymerization condition by the use of the polymerization initiator, and therefore, it may be considered that decomposition to be caused due to oxidation at the time of heat polymerization, or the like can be inhibited, whereby the durability is enhanced. Also, by using the polymerization initiator, a crosslinking reaction proceeds within a short period of time, so that a crosslinked film which is insoluble in a solvent can be formed. Also, when an initiator having an adequate 10 hour half-life temperature is used, the polymerization reaction hardly proceeds at room temperature, and therefore, it may be considered that deposition or gelation of a solid can be inhibited, so that the storage stability is enhanced.

The composition according to the invention is, for example, a composition for organic electroluminescence device, typically a charge transport layer forming composition, and preferably a hole transport layer forming composition. A constitution of this composition is hereunder described.

[1] Cyano Group-Free Azo Based Polymerization Initiator (A):

The composition of the invention contains a cyano group-free azo based polymerization initiator (hereinafter also referred to as "polymerization initiator (A)"). Conventionally known azo based polymerization initiators can be used as the polymerization initiator (A) so far as they do not contain a cyano group. The reasons why in particular, an azo based polymerization initiator is used among various polymerization initiators reside in the matters that the azo based polymerization initiator generates nitrogen as a decomposition product, and this nitrogen differs from oxygen and does not adversely affect the device; and that the azo based polymerization initiator initiates polymerization by heat and is free from photodecomposition different from light irradiation. Examples of the azo based polymerization initiator (A) include a radical polymerization initiator and an organic peroxide. From the viewpoint of a low dielectric constant or the like, a cyano group-free azo based radical polymerization initiator is preferable.

In particular, a compound represented by the following formula (PI) is preferable as the cyano group-free azo based polymerization initiator (A).

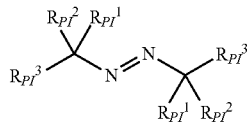

Formula (PI)

In the formula (PI), each of $R_{PI}^1$ and $R_{PI}^2$ independently represents an alkyl group or an aryl group; $R_{PI}^3$ represents —C(=O)—O—$R_{PI}^4$, —O—C(=O)—$R_{PI}^4$, or —C(=O)—NH—$R_{PI}^4$; and $R_{PI}^4$ represents an alkyl group or a cycloalkyl group.

Each of $R_{PI}^1$ and $R_{PI}^2$ independently represents an alkyl group or an aryl group. The alkyl group represented by $R_{PI}^1$ and $R_{PI}^2$ is preferably an alkyl group having from 1 to 10 carbon atoms, more preferably an alkyl group having from 1 to 6 carbon atoms, and most preferably a methyl group.

The aryl group represented by $R_{PI}^1$ and $R_{PI}^2$ is preferably an aryl group having from 6 to 15 carbon atoms, more preferably an aryl group having from 6 to 10 carbon atoms, and mostly preferably a phenyl group.

It is preferable that each of $R_{PI}^1$ and $R_{PI}^2$ independently represents a methyl group or a phenyl group, and preferably a methyl group.

$R_{PI}^3$ represents —C(=O)—O—$R_{PI}^4$, —O—C(=O)—$R_{PI}^4$, or —C(=O)—NH—$R_{PI}^4$. $R_{PI}^3$ is preferably —C(=O)—O—$R_{PI}^4$ or —O—C(=O)—$R_{PI}^4$.

$R_{PI}^4$ represents an alkyl group or a cycloalkyl group. The alkyl group represented by $R_{PI}^4$ is preferably an alkyl group having from 1 to 20 carbon atoms, more preferably an alkyl group having from 1 to 10 carbon atoms, and still more preferably an alkyl group having from 1 to 6 carbon atoms.

The cycloalkyl group represented by $R_{PI}^4$ is preferably a cycloalkyl group having from 3 to 20 carbon atoms, more preferably a cycloalkyl group having from 3 to 10 carbon atoms, and still more preferably a cycloalkyl group having from 5 to 10 carbon atoms. The cycloalkyl group may be monocyclic or polycyclic and is preferably monocyclic.

$R_{PI}^4$ is preferably an alkyl group, more preferably an alkyl group having from 1 to 6 carbon atoms, and most preferably a methyl group.

From the viewpoint of making both appropriate reactivity and keeping of a pot life compatible with each other, it is preferable that a 10 hour half-life temperature of the polymerization initiator (A) is in the range of from 60 to 70° C. The 10 hour half-life temperature as referred to herein means a temperature at which when dissolved in a solvent (mainly toluene), a time until a concentration of the polymerization initiator (A) decreases to a half of the initial value (half-life) is 10 hours, and it is meant that the lower this temperature, the higher the reactivity is. When the 10 hour half-life temperature is not higher than 70° C., the polymerization initiator (A) has appropriate reactivity, whereas when the 10 hour half-life temperature is 60° C. or higher, the polymerization initiator (A) is able to keep an appropriate pot life. The 10 hour half-life temperature can also be obtained from catalogue data of manufacturers who put polymerization initiators corresponding to the polymerization initiator (A) on the market.

Also, as for the polymerization initiator (A), from the viewpoint of more reducing influences of a residue of the polymerization initiator (A) against the device, it is preferable that a decomposition product produced from the polymerization initiator (A) is azeotropic with water. Specific examples of the polymerization initiator (A) capable of producing a decomposition product which is azeotropic with water include V-601 and V-601HP (both of which are manufactured by Wako Pure Chemical Industries, Ltd.). It may be assumed that such an initiator produces an azeotrope by a trace amount of moisture in the solvent or moisture absorption from the atmosphere of the surroundings.

Also, as for the polymerization initiator (A), from the viewpoint of efficiency, it is preferable that a metal content is small. A total amount of metals to be contained is more preferably not more than 500 ppb, and still more preferably not more than 200 ppb.

Next, specific examples of the cyano group-free polymerization initiator represented by the formula (PI) are shown below, but it should not be construed that the invention is limited thereto.

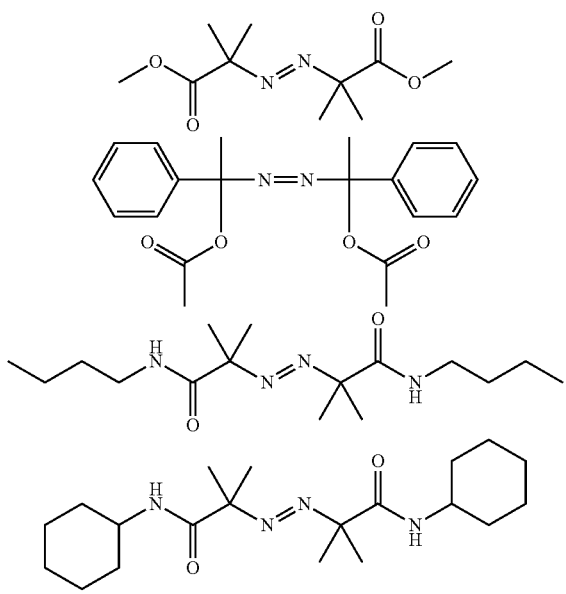

In the invention, the polymerization initiator (A) may be used solely or in combination of two or more kinds thereof.

A content of the polymerization initiator (A) in the composition is preferably from 0.1 to 50% by mass, more preferably from 0.1 to 30% by mass, and still more preferably from 1 to 20% by mass on the basis of a total solids content of the composition. (In this specification, mass ratio is equal to weight ratio.)

[2] Arylamine Derivative Having at Least One Polymerizable Group (B):

The composition of the invention contains an arylamine derivative having at least one polymerizable group (hereinafter also referred to as "arylamine derivative (B)"). Known compounds can be used as the arylamine derivative (B) so far as they are an amine compound having an aryl group as a substituent and further having at least one polymerizable group. The polymerizable group which the arylamine derivative (B) has is not particularly limited, and examples thereof include a radical polymerizable group and a cationic polymerizable group. More specifically, a cationic polymerizable group such as an epoxy group, an oxetanyl group, an oxazolyl group, and a vinyloxy group; or a radical polymerizable group such as an alkenyl group, an alkynyl group, an acrylic acid ester (acryloyl group), a methacrylic acid ester (methacryloyl group), an acrylamide, a methacrylamide, a vinyl ether, and a vinyl ester is preferable. Above all, from the standpoints that the synthesis is easy and that the polymerization reaction proceeds favorably, a radical polymerizable group is preferable, and an alkenyl group or an alkynyl group is more preferable.

Incidentally, examples of the alkenyl group include groups having a double bond at an arbitrary position of an alkyl group, a cycloalkyl group, an aryl group, an aralkyl group, an alkoxy group, or a silicon atom-containing group. Above all, the alkenyl group is preferably one having from 2 to 12 carbon atoms, and more preferably one having from 2 to 6 carbon atoms. Examples thereof include a vinyl group and an allyl group. From the viewpoints of easiness of polymerization controllability and mechanical strength, a vinyl group is preferable.

Examples of the alkynyl group include groups having a triple bond at an arbitrary position of an alkyl group, a cycloalkyl group, an aryl group, an aralkyl group, an alkoxy group, or a silicon atom-containing group. Above all, the alkynyl group is preferably an alkynyl group having from 2 to 12 carbon atoms, and more preferably an alkynyl group having from 2 to 6 carbon atoms. From the viewpoint of easiness of polymerization controllability, an ethynyl group is preferable.

Above all, from the viewpoint of reactivity, the polymerizable group which the arylamine derivative (B) has is preferably either a vinyl group or an allyl group, and most preferably a vinyl group.

From the viewpoints of film hardness and solvent resistance, it is preferable that the arylamine derivative (B) has at least two polymerizable groups.

From the viewpoint of durability of the device, the arylamine derivative (B) is preferably a compound represented by the following formula (1) or formula (2).

Formula (1)

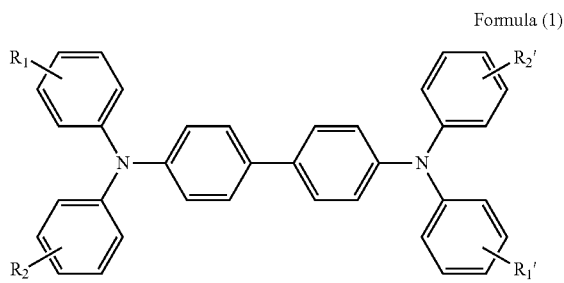

In the formula (1), each of $R_1$ and $R_1'$ independently represents a polymerizable group; and each of $R_2$ and $R_2'$ independently represents a hydrogen atom or a substituent.

Formula (2)

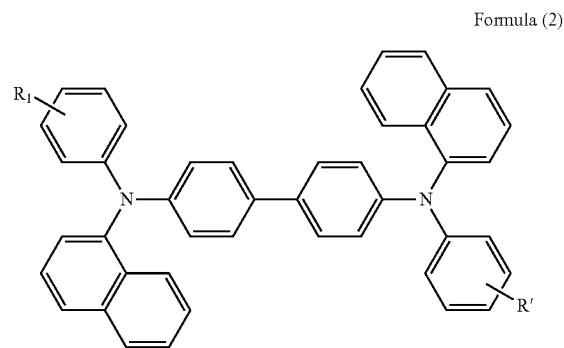

In the formula (2), each of R and R' independently represents a polymerizable group.

Specific examples and preferred ranges of the polymerizable group represented by $R_1$ and $R_1'$ in the foregoing formula (1) and the polymerizable group represented by R and R' in the foregoing formula (2) are the same as those described for the polymerizable group which the arylamine derivative (B) has.

From the viewpoint of external quantum efficiency, the polymerizable group represented by R and R' is substituted at the 3-position or 5-position of the benzene ring.

Each of $R_2$ and $R_2'$ independently represents a hydrogen atom or a substituent. Examples of the substituent represented by $R_2$ and $R_2'$ include an alkyl group, a cycloalkyl group, an aryl group, an aralkyl group, an alkoxy group, and a silicon atom-containing group, each having from 1 to 12 carbon atoms. Of these, an alkyl group having from 1 to 5 carbon atoms is preferable.

From the viewpoint of a high mobility, it is preferable that each of $R_2$ and $R_2'$ is a hydrogen atom.

Next, specific examples of the arylamine derivative having a radical polymerizable group are shown below, but it should not be construed that the invention is limited thereto.

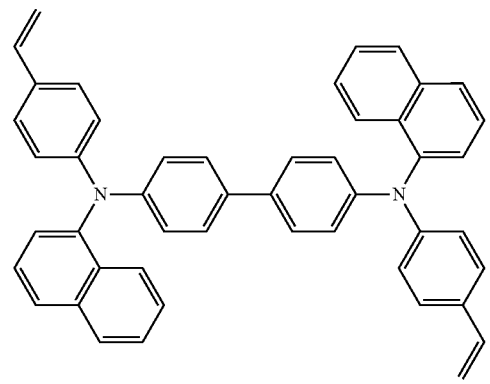

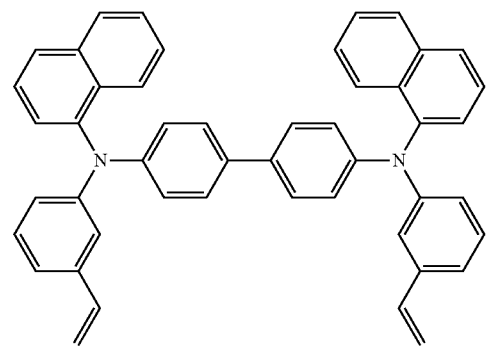

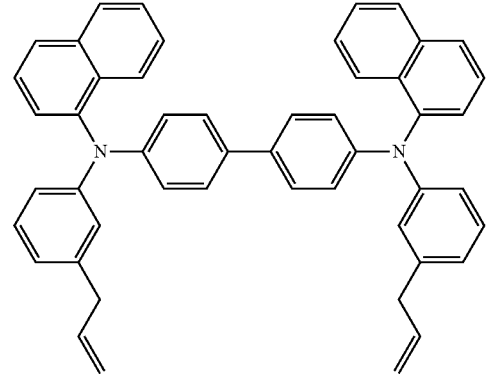

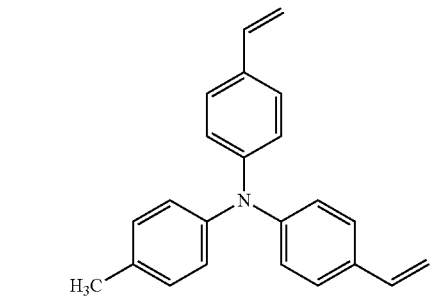

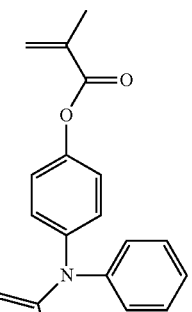

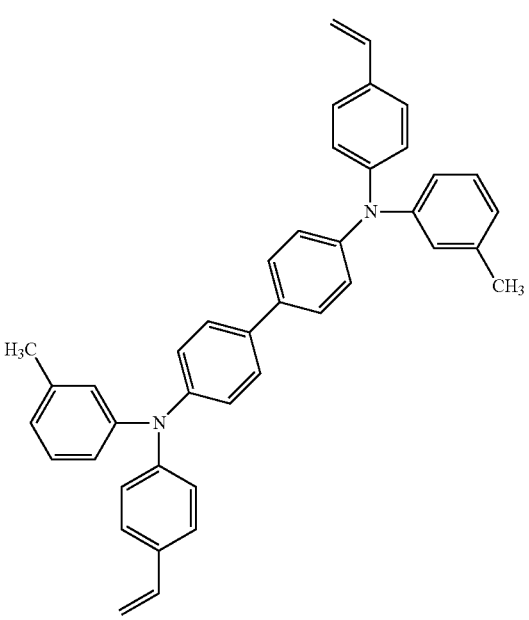

-continued
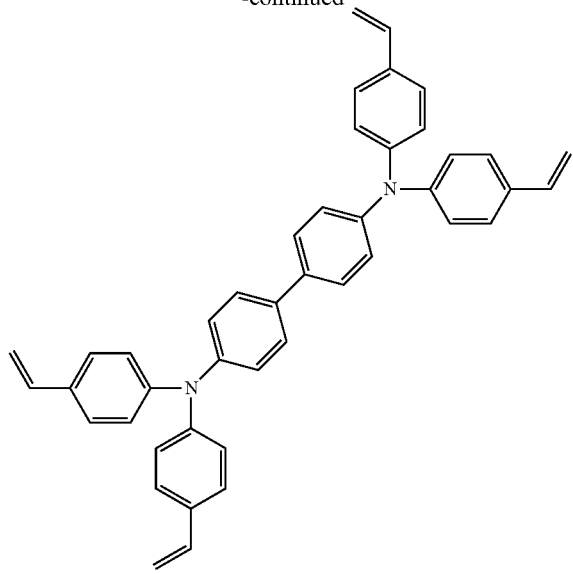
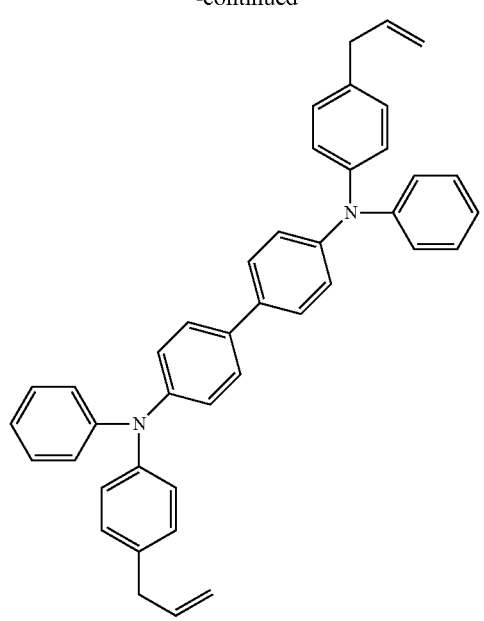
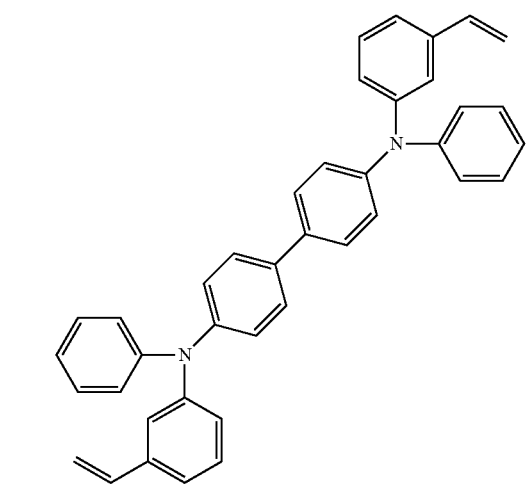 [SMILES: C=Cc1cccc(N(c2ccccc2)c2ccc(-c3ccc(N(c4ccccc4)c4cccc(C=C)n4)cc3)cc2)n1]
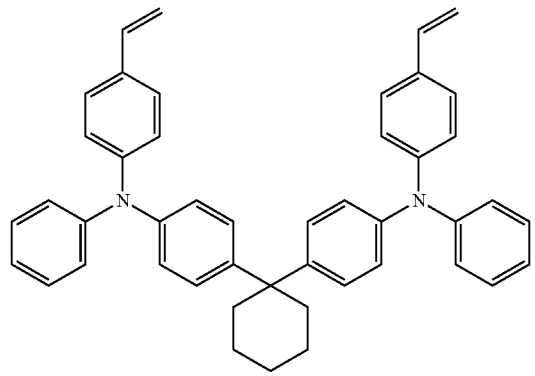
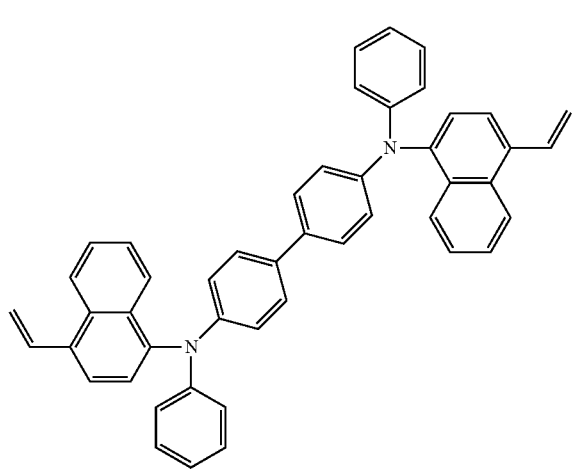
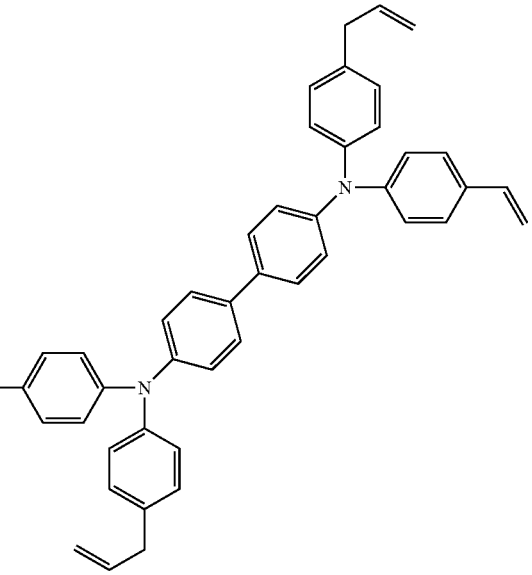

-continued

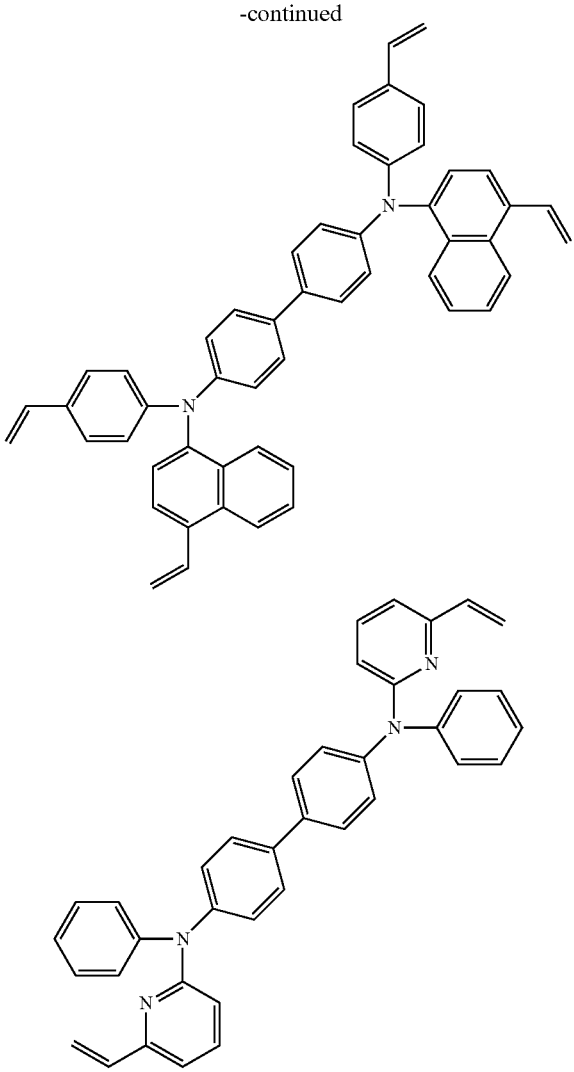

In the invention, the arylamine derivative (B) may be used solely or in combination of two or more kinds thereof.

A content of the arylamine derivative (B) in the composition is preferably from 80 to 99.9% by mass, more preferably from 90 to 99.9% by mass, and still more preferably from 95 to 99% by mass on the basis of the whole of solids of the composition.

[3] Solvent:

Examples of the solvent which can be used at the time of dissolving the foregoing respective components therein to prepare a composition include known organic solvents such as an aromatic hydrocarbon based solvent, an alcohol based solvent, a ketone based solvent, an aliphatic hydrocarbon based solvent, and an amide based solvent.

Examples of the aromatic hydrocarbon based solvent include benzene, toluene, xylene, trimethylbenzene, tetramethylbenzene, cumene, ethylbenzene, methylpropylbenzene, and methylisopropylbenzene. Of these, toluene, xylene, cumene, or trimethylbenzene is more preferable.

Examples of the alcohol based solvent include methanol, ethanol, butanol, benzyl alcohol, and cyclohexanol. Of these, butanol, benzyl alcohol, or cyclohexanol is preferable. A specific dielectric constant of the alcohol based solvent is usually from 10 to 40.

Examples of the ketone based solvent include 1-octanone, 2-octanone, 1-nonanone, 2-nonanone, acetone, 4-heptanone, 1-hexanone, 2-hexanone, 2-butanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate. Of these, 2-butanone, methyl isobutyl ketone, or propylene carbonate is preferable. Examples of the aliphatic hydrocarbon based solvent include pentane, hexane, octane, and decane. Of these, octane or decane is preferable.

Examples of the amide based solvent include N-methyl-2-pyrrolidone, N-ethyl-2-pyrrolidone, N,N-dimethylacetamide, N,N-dimethylformamide, and 1,3-dimethyl-2-imidazolidinone. Of these, N-methyl-2-pyrrolidone or 1,3-dimethyl-2-imidazolidinone is preferable.

In the invention, the foregoing solvent may be used solely or in combination of two or more kinds thereof.

[4] Formation of Film:

The invention is also concerned with a film formed by applying the composition of the invention and heating the coated composition. Also, the film formed from the composition of the invention is useful as a charge transport layer. Furthermore, the invention is concerned with a method for forming a charge transport layer including applying the composition of the invention and heating the coated composition.

The charge transport layer is used preferably in a film thickness of from 5 to 50 nm, and more preferably in a film thickness of from 5 to 40 nm. Such a film thickness can be achieved by setting up a solids concentration in the composition to an adequate range to bring an appropriate viscosity, thereby enhancing coatability and film-forming properties.

The charge transport layer is preferably a hole transport layer, an electron transport layer, an exciton blocking layer, a hole blocking layer, or an electron blocking layer, more preferably a hole transport layer or an exciton blocking layer, and still more preferably a hole transport layer.

A total solids concentration in the composition of the invention is generally from 0.05 to 30% by mass, more preferably from 0.1 to 20% by mass, and still more preferably from 0.1 to 10% by mass.

A viscosity in the composition of the invention is generally from 1 to 30 mPa·s, more preferably from 1.5 to 20 mPa·s, and still more preferably from 1.5 to 15 mPa·s.

The composition of the invention is used by dissolving the foregoing components in a prescribed organic solvent and subjecting the solution to filter filtration, followed by applying on a prescribed support or layer in the following manner. The filter which is used for the filter filtration is preferably a filter made of polytetrafluoroethylene, polyethylene or nylon and having a pore size of not more than 2.0 μm, more preferably not more than 0.5 μm, and still more preferably not more than 0.3 μm.

A coating method of the composition of the invention is not particularly limited. A layer can be formed by any conventionally known coating method. Examples of the coating method include an inkjet method, a spray coating method, a spin coating method, a bar coating method, a transfer method, and a printing method.

Heating temperature and time after coating are not particularly limited so far as the polymerization reaction proceeds. The heating temperature is generally from 100° C. to 200° C., and preferably from 120° C. to 160° C. The heating time is generally from 1 minute to 120 minutes, preferably from 1 minute to 60 minutes, and more preferably from 1 minute to 25 minutes.

[5] Organic Electroluminescence Device:

The organic electroluminescence device in the invention is described in detail.

The organic electroluminescence device in the invention includes a charge transport layer which is formed from the composition of the invention.

More specifically, the organic electroluminescence device in the invention is an organic electroluminescence device including a substrate having thereon a pair of electrodes including an anode and a cathode and at least one organic layer including a light emitting layer between the electrodes, wherein a charge transport layer which is formed from the composition of the invention is included as the at least one organic layer.

In the organic electroluminescence device of the invention, the light emitting layer is an organic layer, and at least one organic layer is included between the light emitting layer and the anode. However, an organic layer may be further included in addition to these organic layers.

In view of properties of the luminescence device, it is preferable that at least one electrode of the anode and the cathode is transparent or translucent.

FIGURE shows one example of a configuration of the organic electroluminescence device according to the invention.

In an organic electroluminescence device 10 according to the invention shown in FIGURE, a light emitting layer 6 is interposed between an anode 3 and a cathode 9 on a supporting substrate 2. Specifically, a hole injection layer 4, a hole transport layer 5, the light emitting layer 6, a hole blocking layer 7, and an electron transport layer 8 are stacked in this order between the anode 3 and the cathode 9.

<Configuration of Organic Layer>

The layer configuration of the organic layer is not particularly limited and can be properly selected depending upon an application and a purpose of the organic electroluminescence device. However, it is preferable that the organic layer is formed on the foregoing transparent electrode or the foregoing back electrode. In that case, the organic layer is formed entirely or partially on the foregoing transparent electrode or the foregoing back electrode.

The organic layer is not particularly limited with respect to its shape, size and thickness and so on and may be properly selected depending upon its purpose.

Specific examples of the layer configuration are exemplified below, but it should not be construed that the invention is limited to these configurations.

Anode/hole transport layer/light emitting layer/electron transport layer/cathode Anode/hole transport layer/light emitting layer/blocking layer/electron transport layer/cathode Anode/hole transport layer/light emitting layer/blocking layer/electron transport layer/electron injection layer/cathode Anode/hole injection layer/hole transport layer/light emitting layer/electron transport layer/electron injection layer/cathode Anode/hole injection layer/hole transport layer/light emitting layer/blocking layer/electron transport layer/cathode Anode/hole injection layer/hole transport layer/light emitting layer/blocking layer/electron transport layer/electron injection layer/cathode Anode/hole injection layer/hole transport layer/exciton blocking layer/light emitting layer/electron transport layer/electron injection layer/cathode The device configuration, substrate, cathode and anode of the organic electroluminescence device are disclosed in detail in, for example, JP-A-2008-270736, and the matters disclosed in this patent document can be applied to the invention.

<Substrate>

It is preferable that the substrate which is used in the invention is a substrate which does not scatter or decay light emitted from the organic layer. In the case of an organic material, it is preferable that the organic material is excellent in heat resistance, dimensional stability, solvent resistance, electric insulating properties, and processability.

<Anode>

In general, the anode may have a function as an electrode for supplying a hole into the organic layer. The anode is not particularly limited with respect to its shape, structure and size and so on and can be properly selected among known electrode materials depending upon an application and a purpose of the luminescence device. As described previously, the anode is usually provided as a transparent anode.

<Cathode>

In general, the cathode may have a function as an electrode for injecting an electron into the organic layer. The cathode is not particularly limited with respect to its shape, structure and size and so on and can be properly selected among known electrode materials depending upon an application and a purpose of the luminescence device.

With respect to the substrate, the anode and the cathode, the matters disclosed in paragraphs [0070] to [0089] of JP-A-2008-270736 can be applied to the invention.

<Organic Layer>

The organic layer in the invention is described.

[Formation of Organic Layer]

In the organic electroluminescence device of the invention, each of the organic layers can be suitably formed by any of a dry film-forming method such as a vapor deposition method and a sputtering method; and a solution coating process such as a transfer method, a printing method, a spin coating method, a bar coating method, an inkjet method, and a spraying method.

In addition to the charge transport layer which is formed from the composition of the invention, it is especially preferable that any one of the organic layers is film-formed by a wet method. Also, other layers can be film-formed by properly selecting a dry method or a wet method. Adoption of a wet method is preferable because a large area of the organic layer can be easily realized, and a luminescence device with high luminance and excellent light emission efficiency is efficiently obtainable at low costs. A vapor deposition method, a sputtering method or the like can be adopted as the dry method; and a dipping method, a spin coating method, a dip coating method, a casting method, a die coating method, a roll coating method, a bar coating method, a gravure coating method, a spray coating method, an inkjet method, or the like can be adopted as the wet method. Such a film forming method can be properly selected according to the material of the organic layer. In the case of achieving the film formation by means of a wet method, drying may be carried out after the film formation. Drying is carried out by selecting a condition of temperature, pressure, or the like in such a manner that the coating layer is not damaged.

In general, the coating liquid which is used in the foregoing wet film-forming method (coating process) is composed of a material of the organic layer and a solvent for dissolving or dispersing it therein. The solvent is not particularly limited, and it may be selected according to the material to be used in the organic layer. Specific examples of the solvent include halogen based solvents (e.g., chloroform, carbon tetrachloride, dichloromethane, 1,2-dichloroethane, chlorobenzene, etc.), ketone based solvents (e.g., acetone, methyl ethyl ketone, diethyl ketone, n-propyl methyl ketone, 2-butanone, cyclohexanone, etc.), aromatic solvents (e.g., benzene, toluene, xylene, etc.), ester based solvents (e.g., ethyl acetate, n-propyl acetate, n-butyl acetate, methyl propionate, ethyl propionate, γ-butyrolactone, diethyl carbonate, etc.), ether based solvents (e.g., tetrahydrofuran, dioxane, etc.), amide based solvents (e.g., dimethylformamide, dimethylacetamide, etc.), dimethyl sulfoxide, alcohol based solvents (e.g., methanol, propanol, butanol, etc.), and water.

Incidentally, a content of a solid matter relative to the solvent in the coating liquid is not particularly limited, and a viscosity of the coating liquid can also be arbitrarily selected according to the film forming method.

[Light Emitting Layer]

In the organic electroluminescence device of the invention, although the light emitting layer contains a light emitting material, it is preferable that the light emitting layer contains a phosphorescence light emitting compound as the light emitting material. The phosphorescent light emitting compound is not particularly limited so far as it is a compound capable of emitting light from a triplet exciton. As the phosphorescent light emitting compound, it is preferable to use an ortho-metalated complex or a porphyrin complex, and it is more preferable to use an ortho-metalated complex. Of the porphyrin complexes, a porphyrin platinum complex is preferable. The phosphorescent light emitting compound may be used solely or in combination of two or more of kinds thereof.

The ortho-metalated complex as referred to in the invention is a generic name of a group of compounds described in YAMAMOTO, Akio, *Organometallic Chemistry—Principles and Applications*, pages 150 and 232, Shokabo Publishing Co., Ltd. (1982); H. Yersin, *Photochemistry and Photophysics of Coordination Compounds*, pages 71 to 77 and 135 to 146, Springer-Verlag (1987); and the like. Although a ligand for forming the ortho-metalated compound is not particularly limited, it is preferably a 2-phenylpyridine derivative, a 7,8-benzoquinoline derivative, a 2-(2-thienyl)pyridine derivative, a 2-(1-naphthyl)pyridine derivative or a 2-phenylquinoline derivative. Such a derivative may have a substituent. Also, the derivative may have other ligand than the ligand which is essential for forming such an ortho-metalated complex. As a central metal for forming the ortho-metalated complex, any metal can be used so far as it is a transition metal. In the invention, rhodium, platinum, gold, iridium, ruthenium, palladium, or the like can be preferably used. Above all, iridium is especially preferable. The organic layer containing such an ortho-metalated complex has excellent light emission luminance and light emission efficiency. As for the ortho-metalated complex, specific examples thereof are also described in paragraphs [0152] to [0180] of Japanese Patent Application No. 2000-254171.

The ortho-metalated complex which is used in the invention can be synthesized according to known techniques such as those described in *Inorg. Chem.*, 30, 1685, 1991; *Inorg. Chem.*, 27, 3464, 1988; *Inorg. Chem.*, 33, 545, 1994; *Inorg. Chim. Acta*, 181, 245, 1991; *J. Organomet. Chem.*, 335, 293, 1987; *J. Am. Chem. Soc.*, 107, 1431, 1985; and so on.

Although a content of the phosphorescent light emitting compound in the light emitting layer is not particularly limited, it is, for example, from 1 to 70% by mass, and preferably from 1 to 20% by mass. When the content of the phosphorescent light emitting compound is less than 0.1% by mass or more than 70% by mass, there may be the case where the effect thereof is not sufficiently exhibited.

In the invention, the light emitting layer may contain a host compound, if desired.

The host compound as referred to herein is a compound which causes energy transfer from an exited state thereof to the phosphorescent light emitting compound, resulting in causing light emission of the phosphorescent light emitting compound. Specific examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, anthraquinodimethane derivatives, anthrone derivatives, diphenylquinone derivatives, thiopyrane dioxide derivatives, carbodiimide derivatives, fluorenylidenemethane derivatives, distyrylpyrazine derivatives, heterocyclic tetracarboxylic acid anhydrides such as naphthalene perillene, phthalocyanine derivatives, metal complexes of 8-quinolinol derivatives, metal complexes having, as a ligand, metal phthalocyanine, benzoxazole, benzothiazole, or the like, polysilane compounds, poly(N-vinylcarbazole) derivatives, aniline copolymers, thiophene oligomers, electrically conductive polymers such as polythiophene, polythiophene derivatives, polyphenylene derivatives, polyphenylene vinylene derivatives, and polyfluorene derivatives. The host compound may be used solely or in combination of two or more kinds thereof.

A thickness of the light emitting layer is preferably from 10 to 200 nm, and more preferably from 20 to 80 nm. When the thickness of the light emitting layer is more than 200 nm, there may be the case where the driving voltage increases, whereas when it is less than 10 nm, there may be the case where a short circuit of the luminescence device occurs.

(Hole Injection Layer and Hole Transport Layer)

It is preferable that the organic electroluminescence device of the invention includes a hole injection layer and a hole transport layer. Each of the hole injection layer and the hole transport layer is a layer having a function to receive a hole from the anode or anode side and to transport it into the cathode side.

From the viewpoints of efficiency and durability, it is preferable that the charge transport layer according to the invention is formed on the hole injection layer containing an iridium (Ir) complex. Also, from the viewpoint of efficiency, it is more preferable that the iridium (Ir) complex has a polymerizable group. Examples of the polymerizable group include an alkoxysilane in addition to those described for the arylamine derivative (B). Specific examples of the Ir complex which is contained in the hole injection layer include Ir complexes described below, but it should not be construed that the invention is limited thereto.

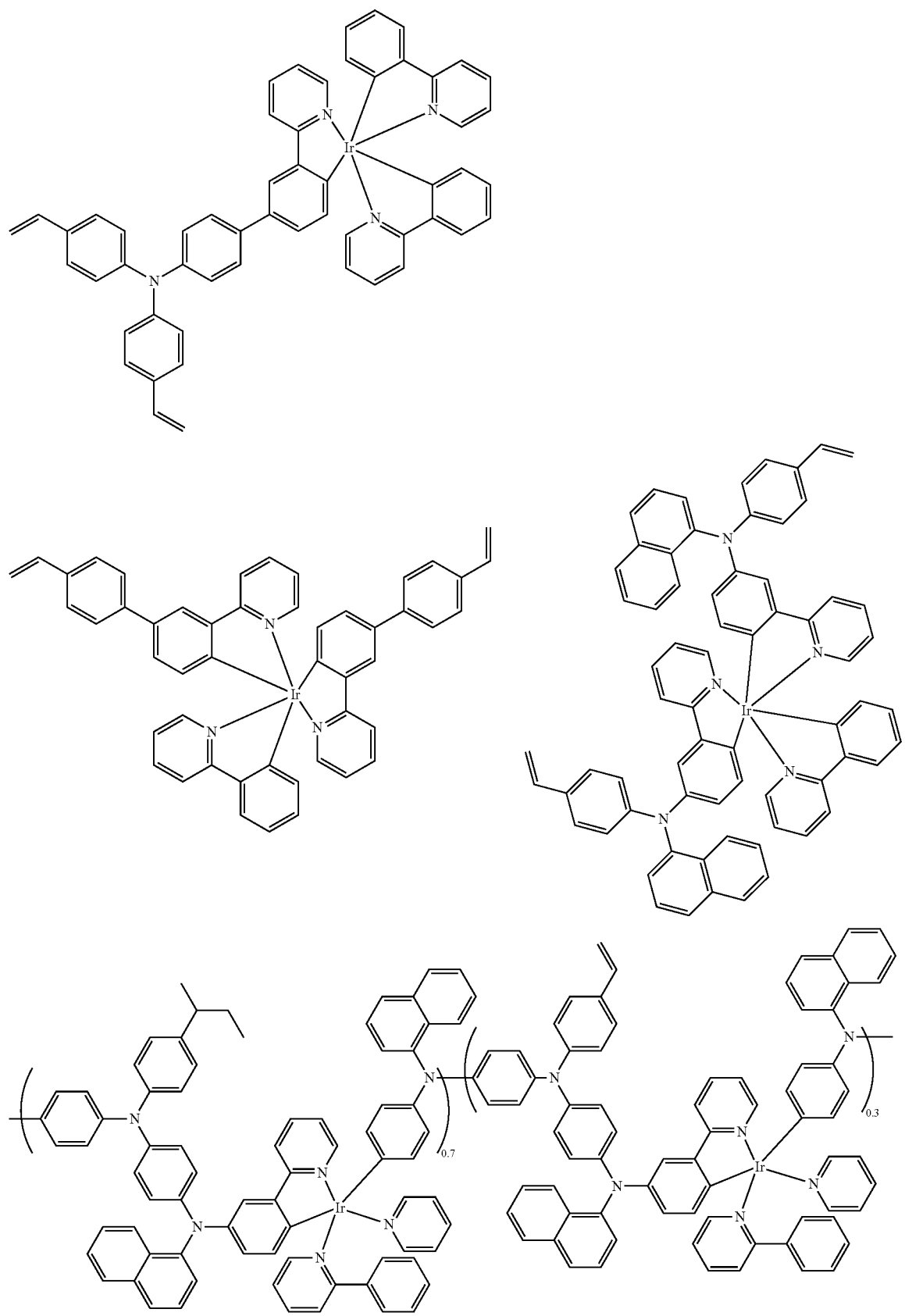

-continued
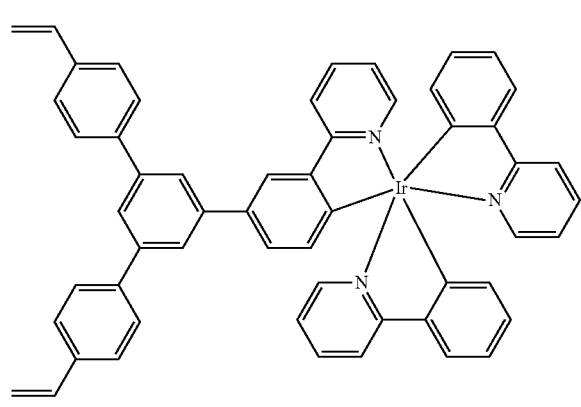
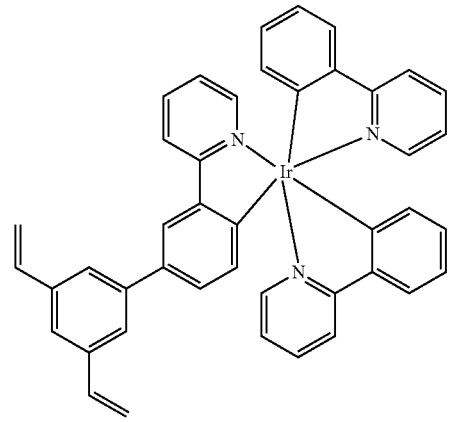
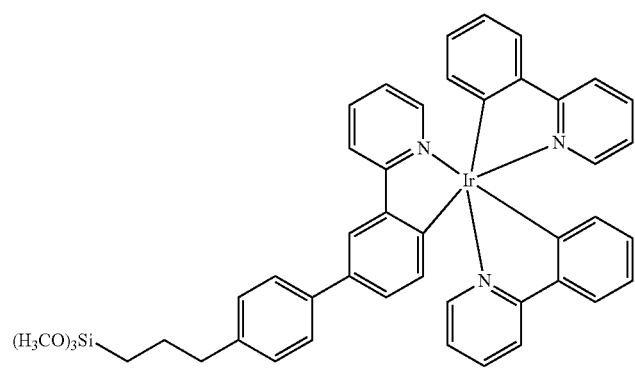
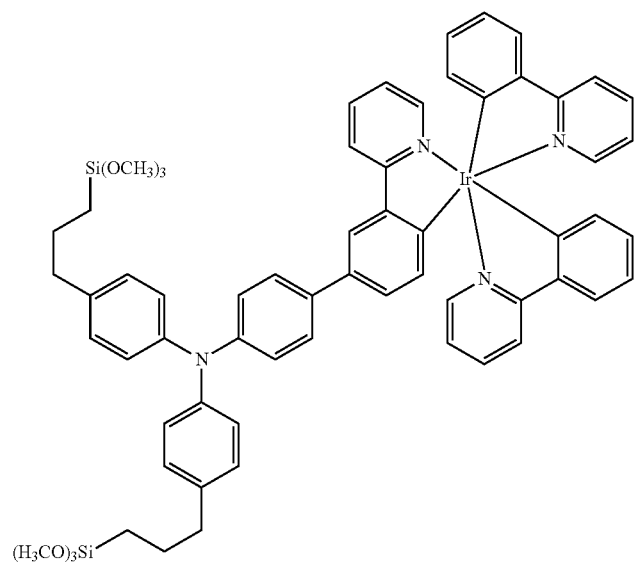

-continued
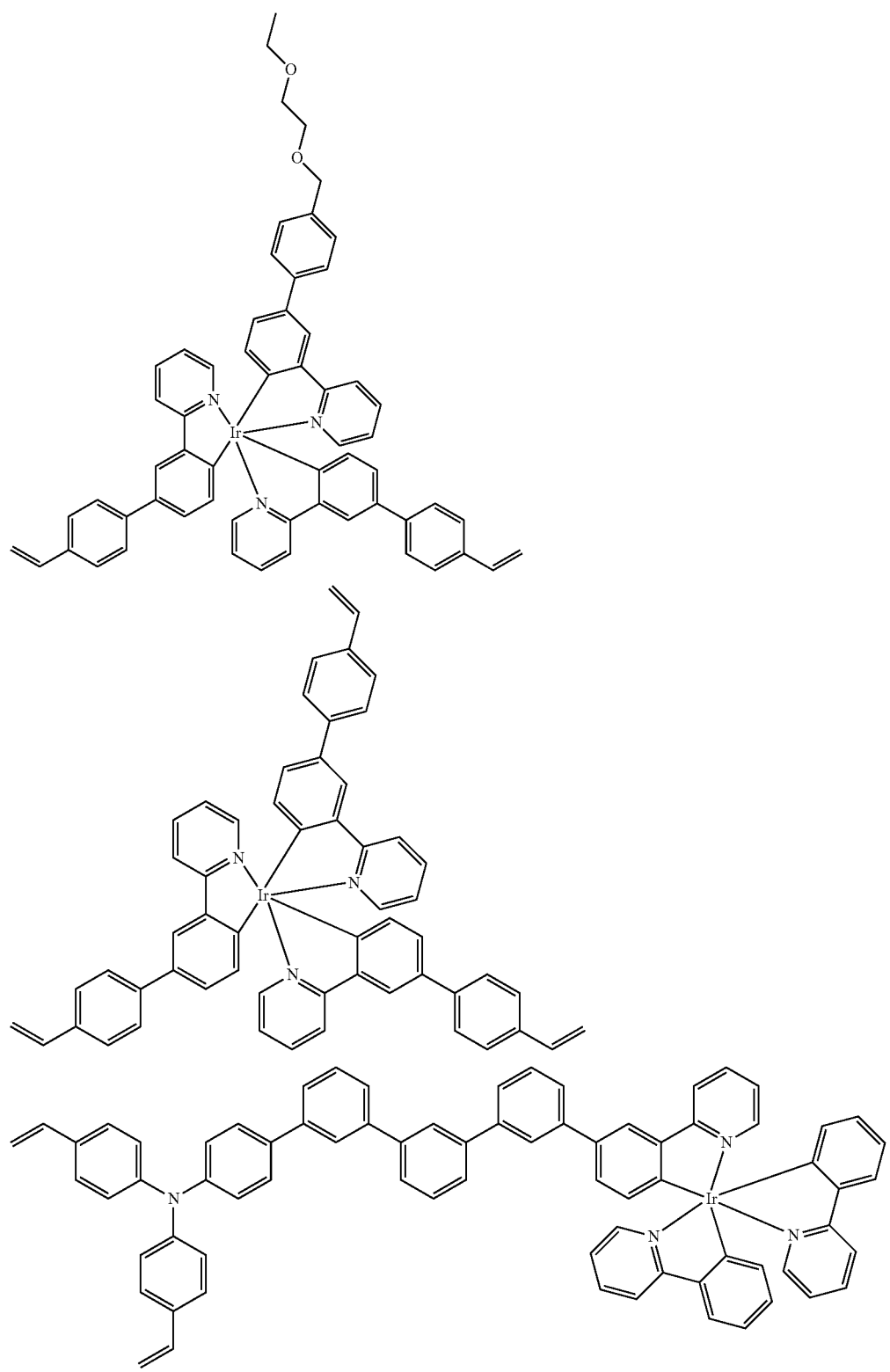

-continued
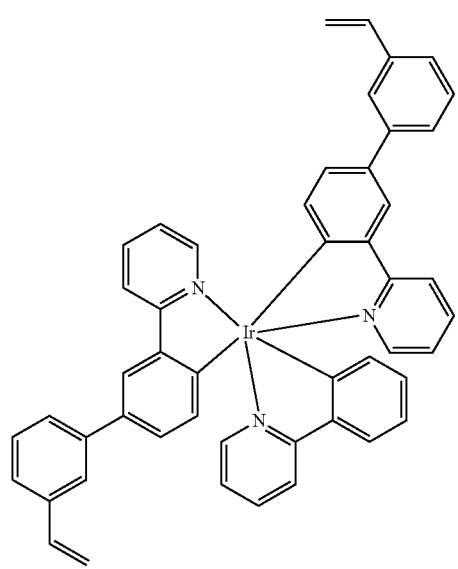
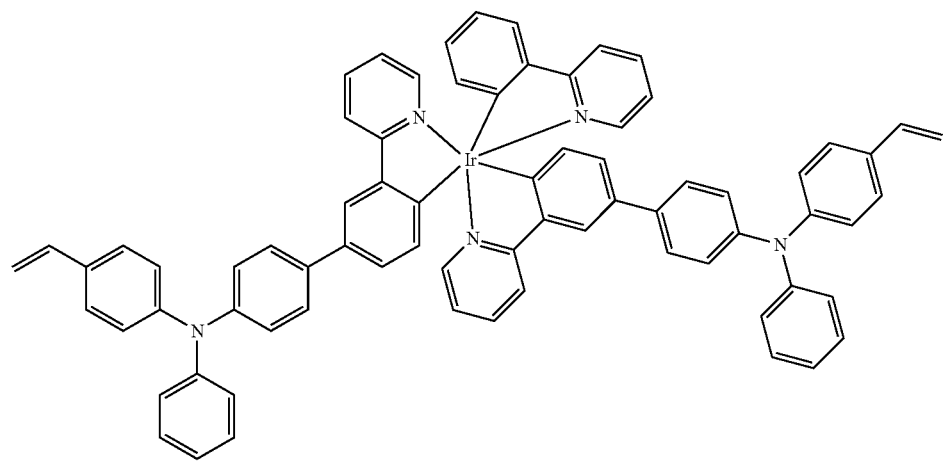
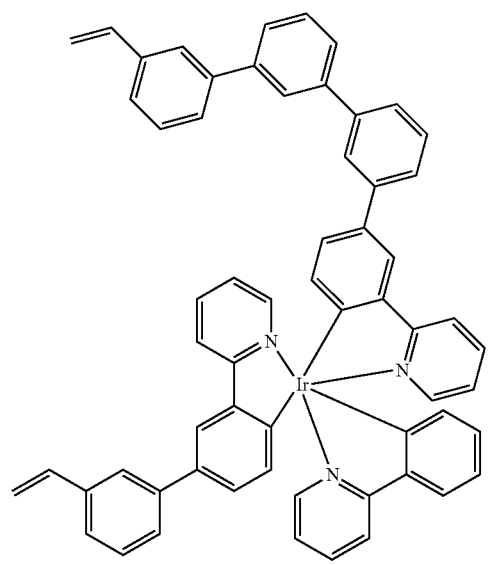

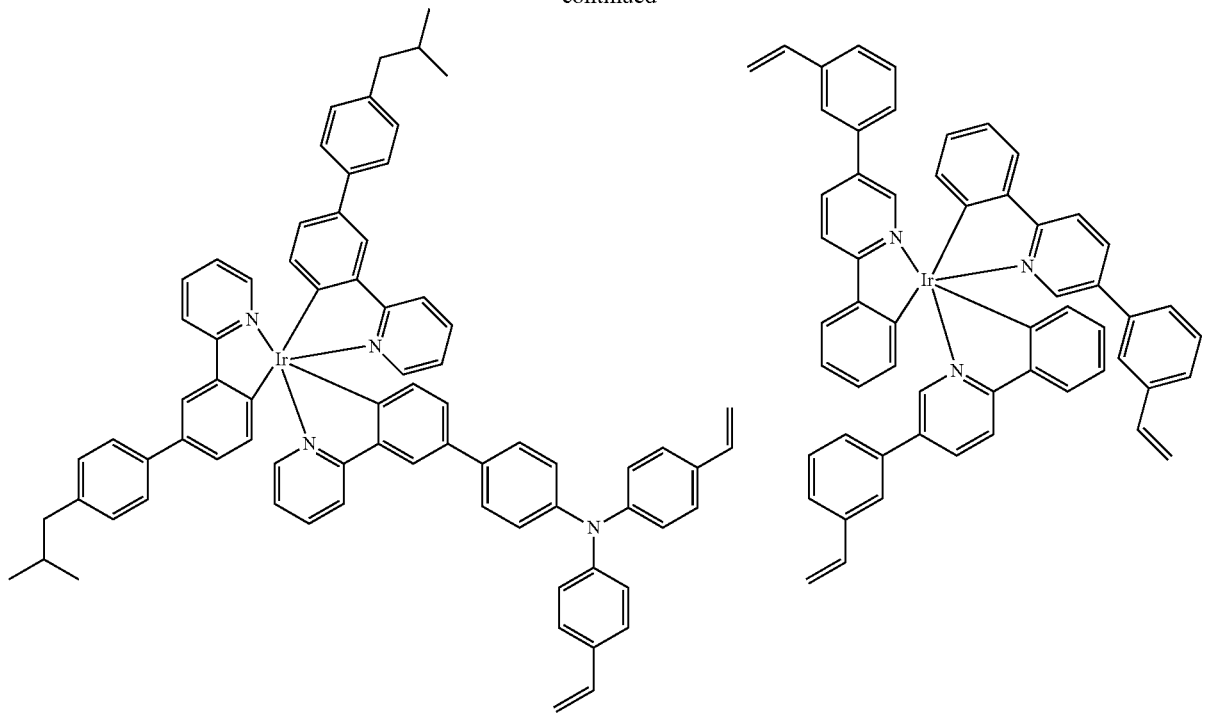

The formation of the charge transport layer according to the invention on the Ir complex-containing hole injection layer contributes to enhancements of the light emission efficiency and device durability.

The hole injection layer and the hole transport layer are described in detail in, for example, JP-A-2008-270736 and JP-A-2007-266458, and the matters described in these parent documents can be applied to the invention.

(Electron Injection Layer and Electron Transport Layer)

The organic electroluminescence device of the invention may also include an electron injection layer and an electron transport layer. Each of the electron injection layer and the electron transport layer is a layer having a function to receive an electron from the cathode or cathode side and to transport it into the anode side. An electron injection material and an electron transport material which are used in these layers may be a low molecular weight material, or may be a polymer material.

The electron injection layer and the electron transport layer are described in detail in, for example, JP-A-2008-270736 and JP-A-2007-266458, and the matters described in these parent documents can be applied to the invention.

(Hole Blocking Layer)

The hole blocking layer is a layer having a function to prevent a hole transported from the anode side into the light emitting layer from going therethrough into the cathode side. In the invention, the hole blocking layer can be provided as an organic layer adjacent to the light emitting layer on the cathode side.

Examples of an organic compound constituting the hole blocking layer include aluminum complexes such as aluminum(III)bis(2-methyl-8-quinolinato)-4-phenylphenolate (abbreviated as "BAlq"), triazole derivatives, phenanthroline derivatives such as 2,9-dimethyl-4,7-diphenyl-1,10-phenanthroline (abbreviated as "BCP"), triphenylene derivatives, and carbazole derivatives.

A thickness of the hole blocking layer is preferably from 1 nm to 500 nm, more preferably from 5 nm to 200 nm, and still more preferably from 10 nm to 100 nm.

The hole blocking layer may be of a single-layered structure composed of one or two or more kinds of the foregoing materials, or may be of a multilayered structure composed of plural layers having a composition of the same kind or different kinds.

(Electron Blocking Layer)

The electron blocking layer is a layer having a function to prevent an electron transported from the cathode side into the light emitting layer from going therethrough into the anode side. In the invention, the electron blocking layer can be provided as an organic layer adjacent to the light emitting layer on the anode side.

As an example of an organic compound constituting the electron blocking layer, for example, those exemplified above for the hole transport material can be applied.

A thickness of the electron blocking layer is preferably from 1 nm to 500 nm, more preferably from 5 nm to 200 nm, and still more preferably from 10 nm to 100 nm.

The electron blocking layer may be of a single-layered structure composed of one or two or more kinds of the foregoing materials, or may be of a multilayered structure composed of plural layers having a composition of the same kind or different kinds.

(Explanation of Exciton Blocking Layer)

An exciton blocking is a layer which is formed at either one or both of an interface between the light emitting layer and the hole transport layer and an interface between the light emitting layer and the electron transporting layer and means a layer for preventing the matter that an exciton formed in the light emitting layer is diffused into the hole transport layer or the electron transport layer and deactivated without causing light emission from occurring. The exciton blocking layer is preferably composed of a carbazole derivative.

[Other Organic Layers]

The organic electroluminescence device of the invention may have a protective layer described in JP-A-7-85974, JP-A-7-192866, JP-A-8-22891, JP-A-10-275682, JP-A-10-106746, or the like. The protective layer is formed on the uppermost surface of the luminescence device. The uppermost surface as referred to herein means an outer surface of a back electrode in the case of stacking a base material, a transparent electrode, an organic layer and a back electrode in this order, whereas it means an outer surface of a transparent electrode in the case of stacking a base material, a back electrode, an organic layer and a transparent electrode in this order. The shape, size, thickness and the like of the protective layer are not particularly limited. A material constituting the protective layer is not particularly limited so far as it has a function to prevent penetration or permeation of a substance which may deteriorate the luminescence device, such as moisture and oxygen, into the device from occurring. Silicon oxide, silicon dioxide, germanium oxide, germanium dioxide, or the like can be used.

A method of forming the protective layer is not particularly limited, and for example, a vacuum vapor deposition method, a sputtering method, a reactive sputtering method, a molecular epitaxy method, a cluster-ion beam method, an ion plating method, a plasma polymerization method, a plasma CVD method, a laser CVD method, a thermal CVD method, a coating method, or the like can be adopted.

[Sealing]

Also, it is preferable that a sealing layer for preventing penetration of moisture or oxygen from occurring is provided in the organic electroluminescence device. As a material for forming the sealing layer, copolymers of tetrafluoroethylene and at least one comonomer; fluorine-containing copolymers having a cyclic structure in a copolymer main chain thereof; polyethylene; polypropylene; polymethyl methacrylate; polyimides; polyurea; polytetrafluoroethylene; polychlorotrifluoro ethylene; polydichlorodifluoroethylene; copolymers of chlorotrifluoroethylene or dichlorodifluoroethylene and other comonomer; water absorbing substances having a coefficient of water absorption of 1% or more; moisture permeation preventive substances having a coefficient of water absorption of not more than 0.1%; metals (e.g., In, Sn, Pb, Au, Cu, Ag, Al, Tl, Ni, etc.); metal oxides (e.g., MgO, SiO, $SiO_2$, $Al_2O_3$, GeO, NiO, CaO, BaO, $Fe_2O_3$, $Y_2O_3$, $TiO_2$, etc.); metal fluorides (e.g., $MgF_2$, LiF, $AlF_3$, $CaF_2$, etc.); liquid fluorinated carbons (e.g., perfluoroalkanes, perfluoroamines, perfluoroethers, etc.); substances obtained by dispersing an adsorbing agent of moisture or oxygen in the liquid fluorinated carbon; and so on can be used.

According to the organic electroluminescence device of the invention, light emission can be obtained by impressing a direct current (alternating current components may be contained, if desired) voltage (usually from 2 volts to 15 volts) or a direct current between the anode and the cathode.

As for the driving method of the organic electroluminescence device of the invention, driving methods described in JP-A-2-148687, JP-A-6-301355, JP-A-5-29080, JP-A-7-134558, JP-A-8-234685, JP-A-8-241047, Japanese Patent No. 2784615, U.S. Pat. Nos. 5,828,429 and 6,023,308, and so on can be applied.

EXAMPLES

The invention is more specifically described below with reference to the Examples. Materials, reagents, amounts of substances and ratios thereof, operations, and the like shown in the following Examples can be appropriately changed unless deviating from the gist of the invention. In consequence, it should be construed that the scope of the invention is not limited to the following specific examples.

Example 1

Fabrication of Organic Electroluminescence Device

On a glass substrate of 0.7 mm in thickness and 25 mm in square, ITO (indium tin oxide) as an anode was subjected to sputtering vapor deposition in a thickness of 150 nm, followed by etching and washing. The substrate having ITO film-formed thereon was put in a washing vessel, ultrasonically washed in 2-propanpl and then subjected to a UV-ozone treatment for 30 minutes. The following respective layers were formed on this glass substrate.

Incidentally, the spin coating and drying, and the annealing treatment were carried out within a glove box (dew point: −60° C., oxygen concentration: 1 ppm).

Subsequently, a hole injection layer coating liquid obtained by dissolving or dispersing 2 parts by mass of PTP-DES represented by the following structural formula (manufactured by Chemipro Kasei Kaisha, Ltd.; weight average molecular weight=13,000; n means a repeating number of the structure within the parenthesis and represents an integer) in 98 parts by mass of cyclohexanone for electronic industrial use (manufactured by Kanto Chemical Co., Inc.) was spin coated on the anode (ITO), dried at 120° C. for 10 minutes, and then subjected to an annealing treatment at 160° C. for 60 minutes, thereby forming a hole injection layer having a thickness of 40 nm.

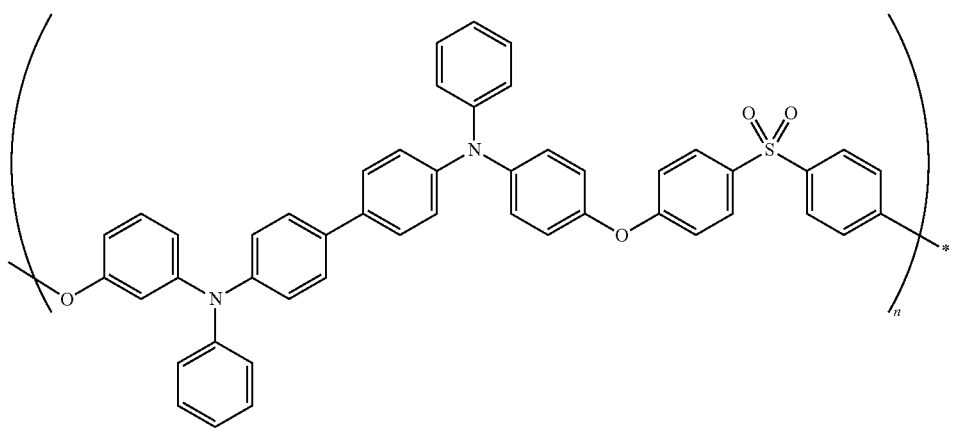

PTPDES

Subsequently, 4 parts by mass of a hole transport material HTL-1 (HTL-1 described in US-A-2008/0220265), which is represented by the following structure, and 0.08 parts by mass of a polymerization initiator V-601 (manufactured by Wako Pure Chemical Industries, Ltd.) having a 10 hour half-life temperature of 66.2° C. and not containing a cyano group, which is represented by the following structure, were dissolved in 996 parts by mass of 2-butanone for electronic industrial use (manufactured by Kanto Chemical Co., Inc.), thereby preparing a hole transport layer coating liquid.

This hole transport layer coating liquid was spin coated on the hole injection layer and dried at 150° C. for 20 minutes, thereby forming a hole transport layer having a thickness of 10 nm.

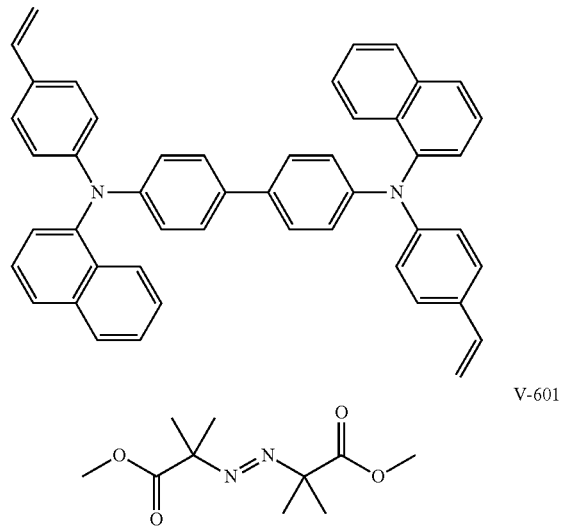

HTL-1

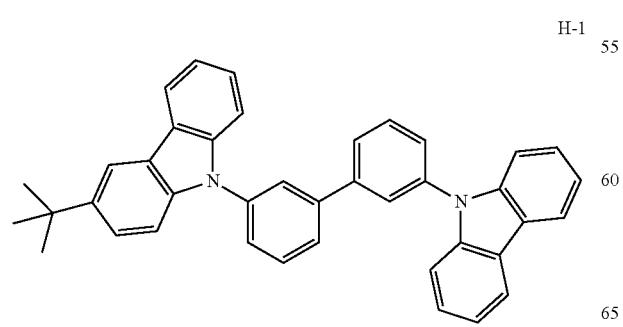

V-601

10 hour half-life temperature: 66.2° C.

On the formed hole transport layer, a light emitting layer coating liquid prepared by dissolving or dispersing 9 parts by mass of Compound H-1 as a host material, which is represented by the following structure, and 1 part by mass of Ir(ppy)₃ (manufactured by Chemipro Kasei Kaisha, Ltd.) as a phosphorescence light emitting material in 990 parts by mass of 2-butanone for electronic industrial use, adding a molecular sieve (a trade name: Molecular Sieve 3A 1/16, manufactured by Wako Pure Chemical Industries, Ltd.) and filtering the mixture with a syringe filter having a hole diameter of 0.22 µm in a glove box was spin coated and dried at 120° C. for 30 minutes, thereby forming a light emitting layer having a thickness of 30 nm on the hole transport layer.

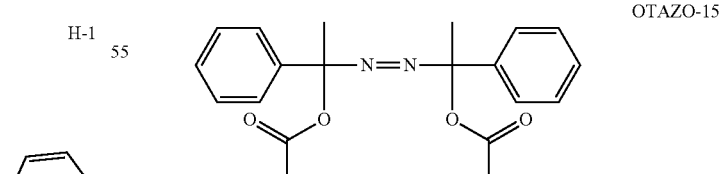

H-1

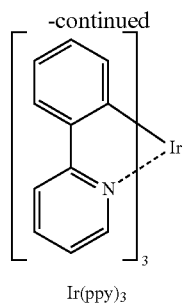

Ir(ppy)₃

Subsequently, BAlq (bis-(2-methyl-8-quinolinolato-4-(phenyl-phenolate)-aluminum-(III)) was vapor deposited on the light emitting layer by means of a vacuum vapor deposition method, thereby forming an electron transport layer having a thickness of 40 nm.

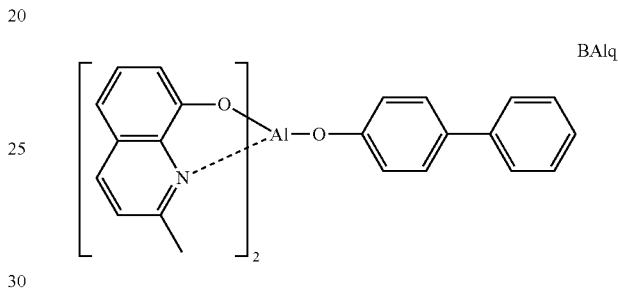

BAlq

Subsequently, lithium fluoride (LiF) was vapor deposited on the electron transport layer, thereby forming an electron injection layer having a thickness of 1 nm.

Subsequently, metallic aluminum was vapor deposited on the electron injection layer, thereby forming a cathode having a thickness of 70 nm.

The fabricated stack was placed in an argon gas-substituted glove box and sealed by using a stainless steel-made sealing can and an ultraviolet ray-curable adhesive (XNR5516HV, manufactured by Nagase-Ciba Ltd.).

Example 2

A device was fabricated by forming a hole transport layer in the same manner as that in Example 1, except that a polymerization initiator OTAZO-15 (manufactured by Otsuka Chemical Co., Ltd.) having a 10 hour half-life temperature of 61° C. and not containing a cyano group, which is represented by the following structure, was used in place of the polymerization initiator V-601 described in Example 1.

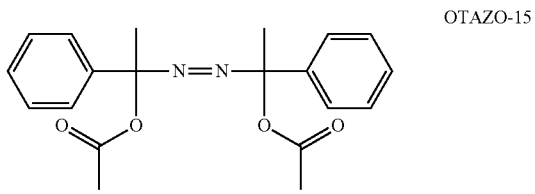 [SMILES: CC(=O)OC(C)(N=NC(C)(OC(C)=O)c1ccccc1)c1ccccc1]

OTAZO-15

10 hour half-life temperature: 61° C.

Example 3

A device was fabricated by forming a hole transport layer in the same manner as that in Example 1, except using V-601HP (manufactured by Wako Pure Chemical Industries, Ltd.) in place of the polymerization initiator V-601 described in Example 1. Although V-601 HP is a polymerization initiator having the same structure as that in V-601, it is a product with a small content of metals so as to have a content of Na of not more than 200 ppb and a content of Li, Cu, etc. of not more than 100 ppb.

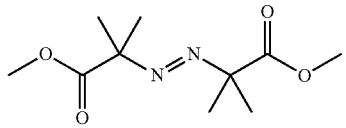

V-601HP 10 hour half-life temperature: 66.2° C.

Comparative Example 1

A device was fabricated by forming a hole transport layer in the same manner as that in Example 1, except that azobisisobutyronitrile (AIBN) (manufactured by Wako Pure Chemical Industries, Ltd.) having a 10 hour half-life temperature of 65° C. and containing a cyano group, which is represented by the following structure, was used in place of the polymerization initiator V-601 described in Example 1.

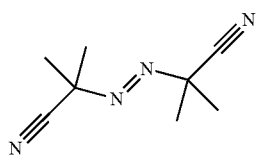

AIBN 10 hour half-life temperature: 65° C.

Comparative Example 2

A device was fabricated by forming a hole transport layer in the same manner as that in Example 1, except that a polymerization initiator V-65 (manufactured by Wako Pure Chemical Industries, Ltd.) having a 10 hour half-life temperature of 51° C. and containing a cyano group, which is represented by the following structure, was used in place of the polymerization initiator V-601 described in Example 1; and that the drying temperature was changed to 130° C.

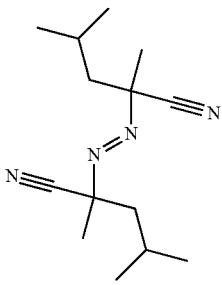

V-65

10 hour half-life temperature: 51° C.

Comparative Example 3

A device was fabricated by forming a hole transport layer in the same manner as that in Example 1, except that a polymerization initiator VPS-0501 (manufactured by Wako Pure Chemical Industries, Ltd.) having a 10 hour half-life temperature of 68° C. and containing a cyano group, which is represented by the following structure, was used in place of the polymerization initiator V-601 described in Example 1.

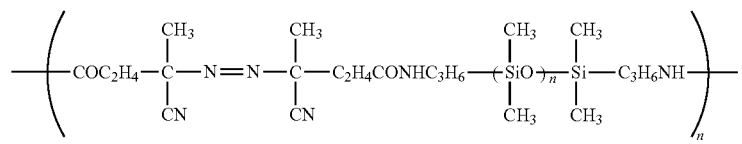

(In the formula, n represents a repeating unit.)

Comparative Example 4

A device was fabricated by forming a hole transport layer in the same manner as that in Example 1, except that a polymerization initiator V-70 (manufactured by Wako Pure Chemical Industries, Ltd.) having a 10 hour half-life temperature of 30° C. and containing a cyano group, which is represented by the following structure, was used in place of the polymerization initiator V-601 described in Example 1.

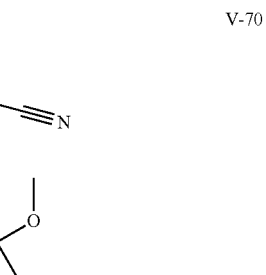

V-70

10 hour half-life temperature: 30° C.

Comparative Example 5

A device was fabricated by forming a hole transport layer in the same manner as that in Example 1, except that a non-azo based polymerization initiator: benzoyl peroxide having a 10 hour half-life temperature of 74° C. and not containing a cyano group was used in place of the polymerization initiator V-601 described in Example 1; and that the drying temperature (polymerization temperature) was changed to 160° C.

Comparative Example 6

A device was fabricated by forming a hole transport layer in the same manner as that in Example 1, except that the polymerization initiator V-601 described in Example 1 was not contained.

Comparative Example 7

A device was fabricated by forming a hole transport layer in the same manner as that in Example 1, except that the polymerization initiator V-601 described in Example 1 was not contained; and that the drying time was changed to 30 minutes.

Comparative Example 8

A device was fabricated by forming a hole transport layer in the same manner as that in Example 1, except that a photopolymerization initiator IRGACURE 907 represented by the following structure was used in place of the polymerization initiator V-601 described in Example 1; and that after drying at 80° C. for 10 minutes, UV exposure was carried out for 10 minutes by using a UV chamber: ELC-500 (manufactured by ELECTRO-LITE CORPORATION), and an annealing treatment was carried out at 80° C. for 30 minutes.

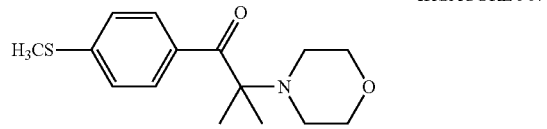

IRGACURE 907

<Evaluation>

(Evaluation of Solvent Resistance of Hole Transport Layer>

On each of the hole transport layers formed in Examples 1 to 3 and Comparative Examples 1 to 8, 60 μL of acetone as a solvent was added dropwise, followed by drying in the air as it was.

After drying, a trace of the droplet on the film surface was evaluated according to two grades of "A" and "B" as described below.

A: A trace of the droplet is not observed.
B: A trace of the droplet is observed.

(Evaluation of Device Performance)

Measurement of External Quantum Efficiency:

Each of the devices was subjected to light emission upon being impressed with a direct current voltage using a source measure unit MODEL 2400, manufactured by Toyo Corporation. Its light emission spectrum and luminance were measured using a spectral analyzer SR-3, manufactured by Topcon Corporation. An external quantum efficiency at a current of 2.5 mA/cm² was calculated based on these numerical values by means of the luminance conversion method.

The external quantum efficiency was evaluated according to three grades of "A", "B" and "C" as described below.

A: 6% or more
B: 4% or more and less than 6%
C: Less than 4%

(Evaluation of Storage Stability of Hole Transport Layer Coating Liquid)

The hole transport layer coating liquid was stored in a glove box (dew point: −60° C., oxygen concentration: 1 ppm) for 24 hours, and its state was observed.

The storage stability was evaluated according to three grades of "A", "B" and "C" as described below.

A: A deposit is not found.
B: A deposit is found.
C: Gelation occurs.

(Device Durability)

A direct current was adjusted such that an initial luminance was 1,000 cd/m² at room temperature, and a time required until the luminance decreased to a half of the initial value was measured. The device durability was evaluated according to four grades of "A", "B", "C" and "D" as described below in terms of a relative value on the basis of Comparative Example 7. Incidentally, the evaluation of the grade "C" or more is demanded from the practical standpoint.

A: 1.2 times or more
B: 1.0 time or more and less than 1.2 times
C: 0.7 times or more and less than 1.0 time
D: Less than 0.7 times The obtained results are shown in Table 1.

TABLE 1

| | Solvent resistance | Efficiency | Storage stability | Durability | Heat drying (heat polymerization) time (min) |
|---|---|---|---|---|---|
| Example 1 | A | B | A | A | 20 |
| Example 2 | A | B | A | B | 20 |
| Example 3 | A | A | A | A | 20 |
| Comparative Example 1 | A | C | A | D | 20 |
| Comparative Example 2 | A | C | B | D | 20 |
| Comparative Example 3 | A | C | C | D | 20 |
| Comparative Example 4 | A | C | B | D | 20 |
| Comparative Example 5 | A | B | A | D | 20 |
| Comparative Example 6 | B | C | A | D | 20 |
| Comparative Example 7 | A | B | A | Basis | 30 |
| Comparative Example 8 | A | C | A | D | — |

Example 4

A device was fabricated by forming a hole transport layer in the same manner as that in Example 1, except for using a hole transport material HTL-2 represented by the following structure in place of the hole transport material HTL-1 described in Example 1.

HTL-2

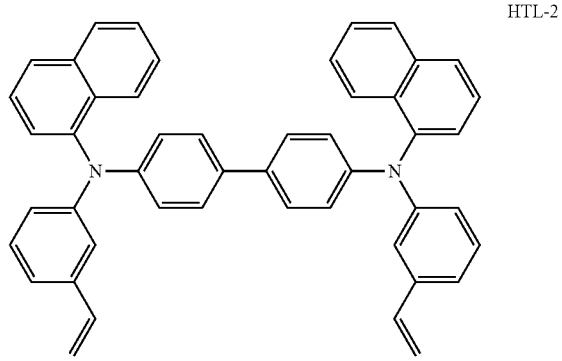 [SMILES: C=Cc1cccc(N(c2ccc(-c3ccc(N(c4cccc(C=C)c4)c4cccc5ccccc45)cc3)cc2)c2cccc3ccccc23)c1]

Example 5

A device was fabricated by forming a hole transport layer in the same manner as that in Example 1, except for using a hole transport material HTL-3 represented by the following structure in place of the hole transport material HTL-1 described in Example 1.

HTL-3

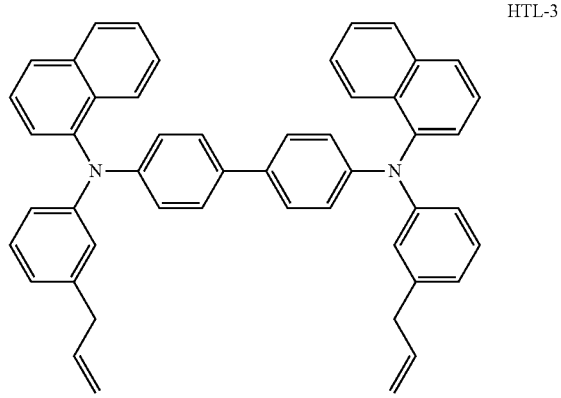 [SMILES: C=CCc1cccc(N(c2ccc(-c3ccc(N(c4cccc(CC=C)c4)c4cccc5ccccc45)cc3)cc2)c2cccc3ccccc23)c1]

Example 6

A device was fabricated by forming a hole transport layer in the same manner as that in Example 1, except for using a hole transport material HTL-4 represented by the following structure in place of the hole transport material HTL-1 described in Example 1.

HTL-4

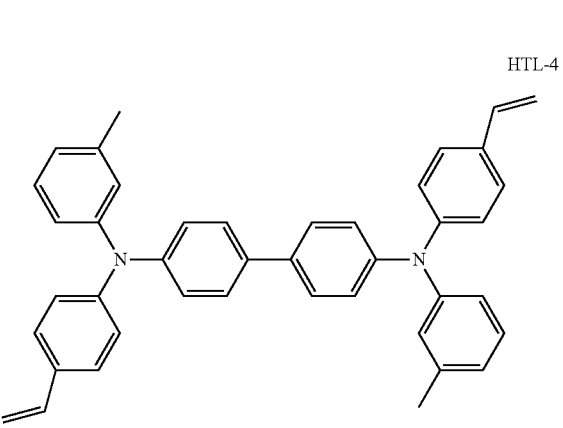 [SMILES: C=Cc1ccc(N(c2ccc(-c3ccc(N(c4ccc(C=C)cc4)c4cccc(C)c4)cc3)cc2)c2cccc(C)c2)cc1]

Example 7

A device was fabricated by forming a hole transport layer in the same manner as that in Example 1, except that a hole injection layer having a thickness of 5 nm, which was formed by spin coating a hole injection layer coating liquid prepared by dissolving or dispersing 5 parts by mass of Compound A (Compound 1 described in US-A-2008/0220265), which is represented by the following structure, in 995 parts by mass of cyclohexanone for electronic industrial use (manufactured by Kanto Chemical Co., Inc.) on the anode (ITO) and drying at 200° C. for 30 minutes, was used in place of the hole injection layer in Example 1; and that a hole transport layer was formed in the same manner as that in Example 4.

Compound A

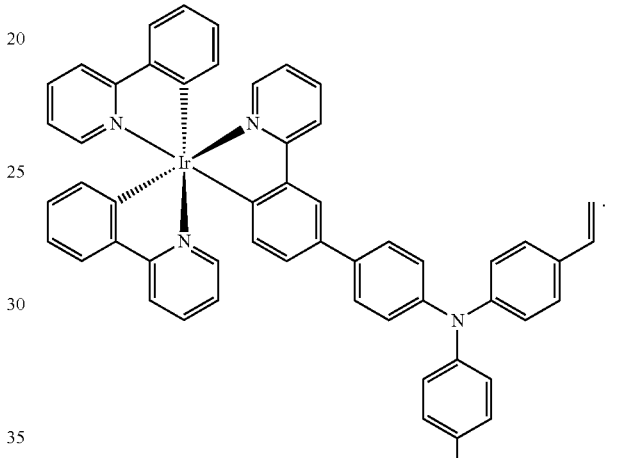

Example 8

A device was fabricated by forming a hole transport layer in the same manner as that in Example 1, except for using a hole transport material HTL-5 represented by the following structure in place of the hole transport material HTL-1 described in Example 1.

HTL-5

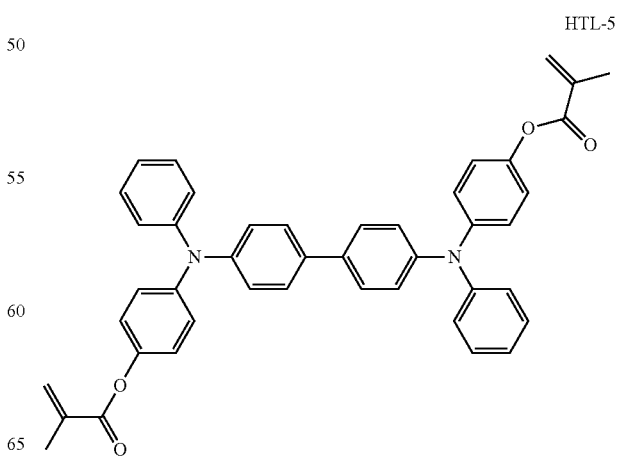

The hole transport layers, the devices and the hole transport layer coating liquids obtained in Examples 4 to 8 were evaluated in the same manners as those in Examples 1 to 3 and Comparative Examples 1 to 8. The obtained results are shown in Table 2.

TABLE 2

|  | Solvent resistance | Efficiency | Storage stability | Durability |
|---|---|---|---|---|
| Example 4 | A | A | A | B |
| Example 5 | A | B | A | B |
| Example 6 | A | B | A | B |
| Example 7 | A | A | A | A |
| Example 8 | A | B | A | C |

As is clear from the results shown in the foregoing Tables 1 and 2, it is noted that the devices of Examples 1 to 8 in which the hole transport layer was formed using a cyano group-free azo based polymerization initiator were enhanced in the efficiency and durability as compared with the devices of Comparative Examples 1 to 4 in which the hole transport layer was formed using a cyano group-containing polymerization initiator.

Furthermore, it is noted from comparison between Examples 1 and 2 that Example 1 using the polymerization initiator V-601, a decomposition product of which is azeotropic with water, was more enhanced in the durability as compared with Example 2 using the polymerization initiator OTAZO-15, a decomposition product of which is not azeotropic with water. Also, it is noted that Example 3 using the polymerization initiator with a small amount of metal impurities was enhanced in the efficiency as compared with Example 1. Moreover, it is noted that Example 7 in which the hole transport layer was coated and polymerized on the hole injection layer made of a polymer of an Ir complex was enhanced in the durability as compared with Example 4.

Also, a degree of polymerization of each of the hole transport layer of Example 1, which was formed by heating for a short period of time (20 minutes), and the hole transport layer of Comparative Example 7, which was formed by heating for 30 minutes, was measured using FT-IR. As a result, it was confirmed that the both were equal to each other in the degree of polymerization. Also, it was confirmed that the both were equal to each other in the solvent resistance, light emission efficiency, storage stability and durability. However, in Comparative Example 7 not using the polymerization initiator according to the invention, in order to obtain performances equal to those of Example 1, the heat drying (heat polymerization) time of 30 minutes was required, a value of which was 1.5 times the heat drying (heat polymerization) time (20 minutes) in Example 1. Also, from comparison between Example 1 and Comparative Example 6, when the heat drying (heat polymerization) time is identical, Example 1 using the polymerization initiator according to the invention was more excellent in the solvent resistance, efficiency and durability than Comparative Example 6.

Meanwhile, in Comparative Example 1 using a cyano group-containing polymerization initiator, although the degree of polymerization was equal to that in Example 1 and Comparative Example 7, the light emission efficiency was lowered by about 40%.

Also, from comparison among Example 1, Example 5 and Example 8, it is noted that the hole transport layer made of a triarylamine derivative having a vinyl group or an allyl group was enhanced in the durability as compared with the hole transport layer made of a triarylamine derivative having a methacryloyl group. Furthermore, it is noted that Comparative Example 5 in which the hole transport layer was formed using benzoyl peroxide which is a cyano group-free non-azo based polymerization initiator was inferior in the durability to Example 1.

Moreover, it is noted that Comparative Example 8 in which the hole transport layer was formed by means of UV exposure was inferior in the efficiency and durability to Example 1.

According to the invention, it is possible to provide a composition which is useful for providing an organic electroluminescence device using an arylamine derivative having a polymerizable group as a material for organic electroluminescence device and keeping favorable efficiency and durability; and which is excellent in storage stability and capable of allowing a polymerization reaction to proceed under a milder condition than that of the related art; and in which a film formed therefrom has high resistance to an organic solvent.

Also, according to the invention, it is possible to provide a film using the foregoing composition, a charge transport layer, an organic electroluminescence device, and a method for forming a charge transport layer.

This application is based on Japanese patent application JP 2010-223255, filed on Sep. 30, 2010, the entire content of which is hereby incorporated by reference, the same as if set forth at length.

What is claimed is:

1. A charge transport layer, which is a film that is formed by applying a composition so as to form a coated composition and heating the coated composition;
   wherein the composition comprises:
   (B) an arylamine derivative having at least two polymerizable groups represented by the following formula (1) or formula (2):

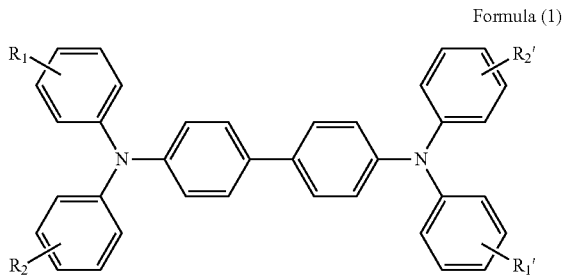

Formula (1)

wherein each of $R_1$ and $R_1'$ independently represents a polymerizable group; and
each of $R_2$, and $R_2'$ independently represents a hydrogen atom or a substituent:

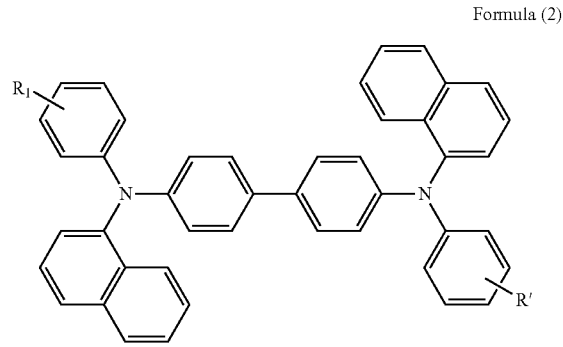

Formula (2)

wherein each of R and R' independently represents a polymerizable group; and (A) a cyano group-free azo based polymerization initiator represented by the following formula (PI):

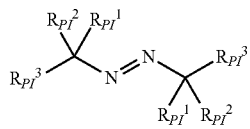

Formula (PI)

wherein each of $R_{PI}^1$ and $R_{PI}^2$ independently represents an alkyl group or an aryl group;

$R_{PI}^3$ represents —C(=O)—O—$R_{PI}^4$, —O—C(=O)—$R_{PI}^4$, or —C(=O)—NH—$R_{PI}^4$; and $R_{PI}^4$ represents an alkyl group or a cycloalkyl group.

2. The charge transport layer according to claim 1, wherein the cyano group-free azo based polymerization initiator (A) has a 10 hour half-life temperature in a range of from 60 to 70°C.

3. The charge transport layer according to claim 1, wherein a decomposition product formed from the cyano group-free azo based polymerization initiator (A) is azeotropic with water.

4. The charge transport layer according to claim 1, wherein the polymerizable group is either a vinyl group or an allyl group.

5. The charge transport layer according to claim 1, wherein at least one of the polymerizable groups is a vinyl group.

6. An organic electroluminescence device, comprising: the charge transport layer according to claim 1.

7. The organic electroluminescence device according to claim 6, wherein the charge transport layer is formed on a hole injection layer containing an iridium complex.

8. A method for forming a charge transport layer, comprising:

applying a composition so as to form a coated composition; and heating the coated composition;

wherein the composition comprises:

(B) an arylamine derivative having at least two polymerizable groups represented by the following formula (1) or formula (2):

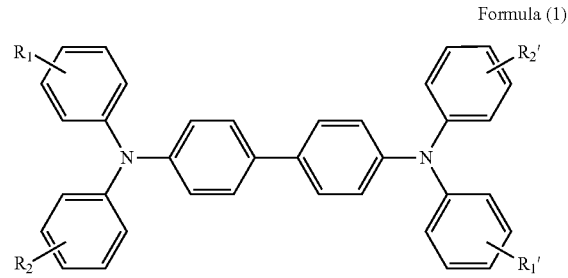

Formula (1)

wherein each of $R_1$ and $R_1'$ independently represents a polymerizable group; and each of $R_2$ and $R_2'$ independently represents a hydrogen atom or a substituent:

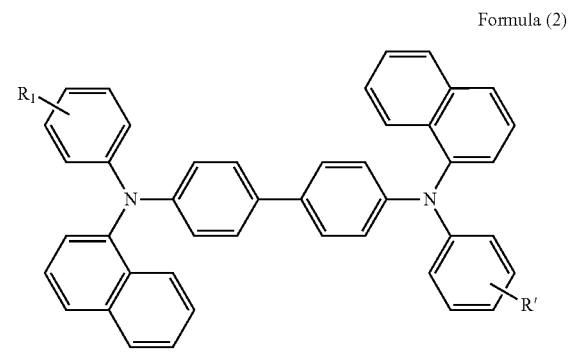

Formula (2)

wherein each of R and R' independently represents a polymerizable group; and (A) a cyano group-free azo based polymerization initiator represented by the following formula (PI):

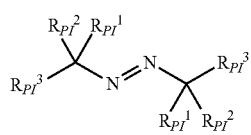

Formula (PI)

wherein each of $R_{PI}^1$ and $R_{PI}^2$ independently represents an alkyl group or an aryl group;

$R_{PI}^3$ represents —C(=O)—O—$R_{PI}^4$, —O—C(=O)—$R_{PI}^4$, or —C(=O)—NH—$R_{PI}^4$; and $R_{PI}^4$ represents an alkyl group or a cycloalkyl group.

* * * * *